(12) United States Patent
Ichihara

(10) Patent No.: US 6,765,683 B2
(45) Date of Patent: Jul. 20, 2004

(54) INTERFEROMETER SYSTEM AND METHOD OF MANUFACTURING PROJECTION OPTICAL SYSTEM USING SAME

(75) Inventor: Hiroshi Ichihara, Yokohama (JP)

(73) Assignee: Nikon Corporation, Tokyo (JP)

( * ) Notice: Subject to any disclaimer, the term of this patent is extended or adjusted under 35 U.S.C. 154(b) by 283 days.

(21) Appl. No.: 10/217,015

(22) Filed: Aug. 13, 2002

(65) Prior Publication Data

US 2002/0191195 A1 Dec. 19, 2002

Related U.S. Application Data

(62) Division of application No. 09/870,734, filed on Jun. 1, 2001, now Pat. No. 6,456,382, which is a division of application No. 09/401,552, filed on Sep. 22, 1999, now Pat. No. 6,312,373.

(30) Foreign Application Priority Data

Sep. 22, 1998 (JP) .......................................... 10-268582
Sep. 22, 1998 (JP) .......................................... 10-268793

(51) Int. Cl.$^7$ .............................................. G01B 9/02
(52) U.S. Cl. ..................................................... 356/521
(58) Field of Search ................................ 356/521, 512, 356/513, 514, 515

(56) References Cited

U.S. PATENT DOCUMENTS

| | | |
|---|---|---|
| 3,998,553 A | 12/1976 | Hunter et al. |
| 5,076,695 A | 12/1991 | Ichihara |
| 5,485,275 A | 1/1996 | Ohtsuka |
| 5,625,454 A | 4/1997 | Huang et al. |
| 5,737,079 A | 4/1998 | Burge et al. |
| 5,768,150 A | 6/1998 | Sonoda et al. |
| 5,805,273 A | 9/1998 | Unno |
| 5,835,217 A | 11/1998 | Medecki |
| 5,898,501 A | 4/1999 | Suzuki et al. |
| 5,986,760 A | 11/1999 | Nakayama et al. |
| 6,111,646 A * | 8/2000 | Naulleau et al. ............ 356/494 |
| 6,118,535 A * | 9/2000 | Goldberg et al. ........... 356/521 |

OTHER PUBLICATIONS

Gomei et al, Current status of ASET–HIT EUV phase–shifting poin diffraction interferometer, SPIE vol. 4506, pp 39–45.*

"Phase–Shifting Point Diffraction Interferometer", by H. Medecki et al., Optics Letters, vol. 21, No. 19, pp. 1526–1528, Oct. 1, 1996.

* cited by examiner

Primary Examiner—Samuel A. Turner
(74) Attorney, Agent, or Firm—Oliff & Berridge PLC

(57) ABSTRACT

A method of manufacturing a projection optical system (37) for projecting a pattern from a reticle to a photosensitive substrate, comprising a surface-shape-measuring step wherein the shape of an optical test surface (38) of an optical element (36) which is a component in the projection optical system is measured by causing interference between light from the optical surface (38) and light from an aspheric reference surface (70) while the optical test surface (38) and said reference surface (70) are held in integral fashion in close mutual proximity. A wavefront-aberration-measuring step is included, wherein the optical element is assembled in the projection optical system and the wavefront aberration of the projection optical system is measured. A surface correction calculation step is also included wherein the amount by which the shape of the optical test surface should be corrected is calculated based on wavefront aberration data obtained at the wavefront-aberration-measuring step and surface shape data obtained from the surface-shape-measuring step. The method also includes a surface shape correction step wherein the shape of the optical test surface is corrected based on calculation performed at the surface correction calculation step. Surface shape measuring interferometer systems and wavefront-aberration-measuring interferometer systems (22J–22Q) used in performing the manufacturing method are also disclosed.

10 Claims, 21 Drawing Sheets

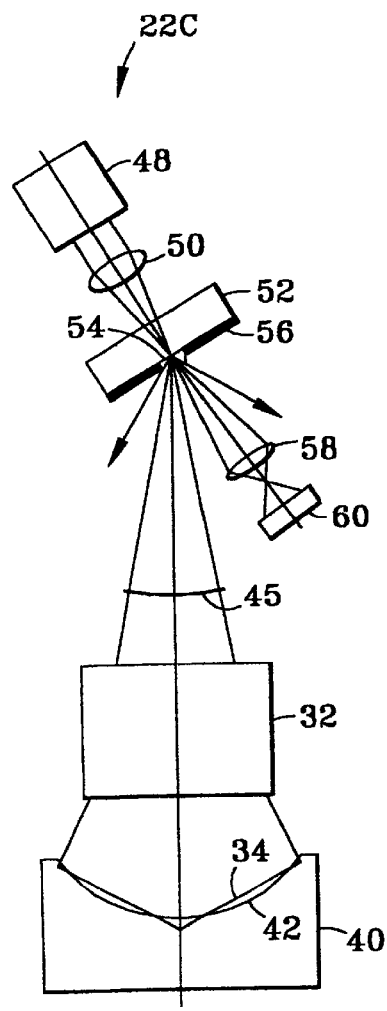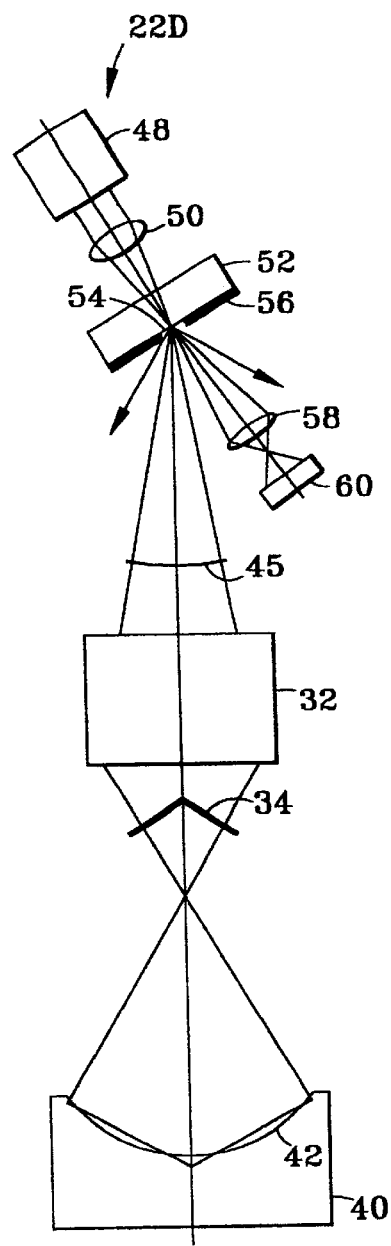
FIG. 4a
FIG. 4b

COMPARATIVE EXAMPLE

INTERFEROMETER SYSTEM AND METHOD OF MANUFACTURING PROJECTION OPTICAL SYSTEM USING SAME

This is a Division of application Ser. No. 09/870,734 filed Jun. 1, 2001 now U.S. Pat. No. 6,456,382, which in turn is a Division of application Ser. No. 09/401,552 filed Sep. 22, 1999 (now U.S. Patent No. 6,312,373). The entire disclosure of the prior application(s) is hereby incorporated by reference herein in its entirety.

FIELD OF THE INVENTION

The present invention relates to an interferometer system for measuring the shape of an aspheric surface of an optical element in an optical system and for measuring the wavefront aberration of such an optical system, particularly in connection with manufacture of a projection optical system suited to for use in an exposure apparatus employing soft-X-ray (EUV) exposure light.

BACKGROUND OF THE INVENTION

Light of wavelength 193 nm or longer has hitherto been used as the exposure light in lithographic equipment used when manufacturing semiconductor devices such as integrated circuits, liquid crystal displays, and thin film magnetic heads. The surfaces of lenses used in projection optical systems of such lithographic equipment are normally spherical, and the accuracy in the lens shape is 1 to 2 nm RMS (root mean square).

With the advance in microminiaturization of the patterns on semiconductor devices in recent years, there has been a demand for exposure apparatus that use wavelengths shorter than those used heretofore to achieve even greater microminiaturization. In particular, there has been a demand for the development and manufacture of projection exposure apparatus that use soft X-rays of wavelength of 11 to 13 nm.

Lenses (i.e., dioptric optical elements) cannot be used in the EUV wavelength region due to absorption, so catoptric projection optical systems (i.e., systems comprising only reflective surfaces) are employed. In addition, since a reflectance of only about 70% can be expected from reflective surfaces in the soft X-ray wavelength region, only three to six reflective surfaces can be used in a practical projection optical system.

Accordingly, to make an EUV projection optical system aberration-free with just a few reflective surfaces, all reflective surfaces are made aspheric. Furthermore, in the case of a projection optical system having four reflective surfaces, a reflective surface shape accuracy of 0.23 nm RMS is required. One method of forming an aspheric surface shape with this accuracy is to measure the actual surface shape using an interferometer and to use a corrective grinding machine to grind the surface to the desired shape.

In a conventional surface-shape-measuring interferometer, measurement repeatability is accurate to 0.3 nm RMS, the absolute accuracy for a spherical surface is 1 nm RMS, and the absolute accuracy of an aspheric surface is approximately 10 nm RMS. Therefore, the required accuracy cannot possibly be satisfied. As a result, a projection optical system designed to have a desired performance cannot be manufactured.

So-called null interferometric measurement using a null (compensating) element has hitherto been conducted for the measurement of aspheric surface shapes. Null lenses that use spherical lenses comprising spherical surfaces, and zone plates wherein annular diffraction gratings are formed on plane plates have principally been used as null elements.

FIG. 1 shows a conventional interferometer system 122 arrangement for null measurement using a null (compensating) element 132. The interferometric measurement described herein is a slightly modified version of a Fizeau interferometric measurement. Namely, a plane wave 126 emitted from an interferometric light source 124 is partially reflected by a high-precision Fizeau surface 130 formed on a Fizeau plane plate 128. The component of plane wave 126 transmitted through Fizeau surface 130 is converted into measurement wavefront (null wavefront) 134 by null element 132 and assumes a desired aspheric design shape at a measurement reference position RP, following which it arrives at a test surface 138 of a test object 136 previously set at the reference position. The light arriving at test surface 138 is reflected therefrom and interferes with the light component reflected from Fizeau surface 130, and forms monochromatic interference fringes inside interferometer system 122. These interference fringes are detected by a detector such as a CCD (not shown). A signal outputted by the detector is analyzed by an information processing system (not shown) that processes the interferometer information contained in the output signal. Similar measurements can be performed using a Twyman-Green interferometer.

To accurately ascertain the shape of test surface 138, the null element 132 must be manufactured with advanced technology since there must be no error in the null wavefront. Specifically, this means that the optical characteristics of the null element 132 must be measured beforehand with high precision. Based on these measurements, the shape of null wavefront 134 is then determined by ray tracing. This results in the manufacture of null element 132 taking a long time. Consequently, the measurement of the desired aspheric surface takes a long time.

FIG. 2 shows another example of a conventional Fizeau interferometer 222. Referring to FIG. 2, laser light from laser 224 passes through a lens system 226 to become a collimated light beam of a prescribed diameter and is incident Fizeau plate 228. Rear side 230 of Fizeau plate 228 is accurately ground to a highly flat surface, and the component of the incident light reflected by rear side 230 of Fizeau plate 228 becomes a reference beam having a plane wavefront. The component of incident light transmitted through a Fizeau plate 228 passes through null element 232, where the plane wavefront where the plane wavefront is converted to a desired aspheric wavefront. The aspheric wavefront is then incident in perpendicular fashion an aspheric test surface 238. The light reflected by test surface 238 returns along the original optical path, is superimposed on the reference light beam, reflects off a beam splitting element 256 in lens system 226, and forms interference fringes on a CCD detector 260. By processing these interference fringes by a computer (not shown), the shape error can be measured.

A problem with interferometer 222 is deterioration, in absolute accuracy, due to null element 232. A null element comprising a number of high-precision lenses (e.g., lenses 234 and 236) a CGH (computer-generated hologram), or the like is ordinarily used as null element 232, and manufacturing errors on the order of 10 nm RMS typically result.

Since interferometer 222 tends to be affected by vibration and air fluctuations due to the separation of reference surface 230 (i.e., rear side of Fizeau plate 228) and test surface 238. Repeatability is also poor, at 0.3 nm RMS. Furthermore, in measuring an aspheric surface, alignment of null element 232 and test surface 238 is critical. Measurement repeatability deteriorates by several nanometers if alignment accuracy is poor.

SUMMARY OF THE INVENTION

The present invention relates to an interferometer system for measuring the shape of an aspheric surface of an optical element in an optical system and for measuring the wavefront aberration of such an optical system, particularly in connection with manufacture of a projection optical system suited to for use in an exposure apparatus employing soft-X-ray (EUV) exposure light.

The goal of the present invention is to overcome the above-described deficiencies in the prior art so as to permit fast and accurate calibration of a null wavefront corresponding to an aspheric surface accurate to very high dimensional tolerances.

Another goal of the present invention is to manufacture a projection optical system having excellent performance.

Additional goals of the present invention are to provide an aspheric-surface-shape measuring interferometer having good reproducibility, to measure wavefront aberration with high precision and to permit calibration of an aspheric-surface-shape measuring interferometer so as to improve absolute accuracy in precision surface measurements.

Accordingly, a first aspect of the invention is an interferometer capable of measuring a surface shape of a target surface as compared to a reflector standard. The interferometer comprises a light source capable of generating a light beam, and a reference surface arranged downstream of the light source for reflecting the light beam so as to form a reference wavefront. The interferometer further includes a null element arranged downstream of the reference surface for forming a desired null wavefront from the light beam. The null element is arranged such that the null wavefront is incident the target surface so as to form a measurement wavefront and is also incident the reflector standard when the latter is alternately arranged in place of the target surface so as to form a reflector standard wavefront. The interferometer further includes a detector arranged so as to detect interference fringes caused by interference between the measurement wavefront and the reference wavefront. The detection of the interference fringes takes into account the reflector standard wavefront.

A second aspect of the invention is a method of manufacturing a projection optical system capable of projecting a pattern from a reticle onto a photosensitive substrate. The method comprises the steps of first measuring a shape of a test surface of an optical element that is a component of the projection optical system by causing interference between light from the test surface and light from an aspheric reference surface while the test surface and the aspheric reference surface are held integrally and in close proximity to one another. The next step is assembling the optical element in the projection optical system and measuring the wavefront aberration of the projection optical system. The next step is then determining an amount by which the shape of the test surface should be corrected based on the measured wavefront aberration obtained in the step b. Then, the final step is correcting the shape of the test surface based on the amount by which the shape of the test surface should be corrected as determined above.

A third aspect of the invention is an interferometer for measuring wavefront aberration of an optical system having an object plane and an image plane. The interferometer comprises a light source for supplying light of a predetermined wavelength, a first pinhole member capable of forming a first spherical wavefront from the light arranged at one of the object plane and the image plane. The first pinhole member has a plurality of first pinholes arrayed in two dimensions along a surface perpendicular to an optical axis of the optical system. The interferometer further includes a second pinhole member arranged at the opposite one of the object plane and the image plane of the first pinhole member. The second pinhole member has a plurality of second pinholes arrayed at a position corresponding to the imaging position where the plurality of first pinholes is imaged by the optical system. The interferometer also includes a diffraction grating arranged in the optical path between the first and second pinhole members, and a diffracted light plate member that selectively transmits diffracted light of one or more higher predetermined diffraction orders associated with the diffraction grating. The interferometer also includes a detector arranged to detect interference fringes arising from the interference between a second spherical wavefront generated by a zeroeth diffraction order passing through the second pinhole member and the one or more higher predetermined diffraction orders passing through the diffracted light plate member.

A fourth aspect of the invention is an interferometer calibration method for measuring a surface shape of an optical element of an optical system. The method comprises the steps of first, interferometrically measuring the surface shape of the optical element to obtain a surface shape measurement value, then assembling the optical system by including the optical element in the optical system, then measuring a wavefront aberration of the optical system, then separating the wavefront aberration into a component corresponding to positional error of the surface shape and a component corresponding to surface shape error, then correcting the positional error component and calculating the surface shape error component, and then finally correcting the surface shape measurement value using the surface shape error component as previously calculated

BRIEF DESCRIPTION OF THE DRAWINGS

FIGS. 4a and 4b are schematic optical diagrams of third and fourth surface-shape-measuring interferometers of a first embodiment according to a first aspect of the present invention;

FIG. 10b is a cross-sectional diagram of a second semi-transparent film with a pinhole plate in the interferometer of FIG. 10a;

FIG. 11a is a schematic optical diagram of a second wavefront-aberration-measuring interferometer that is a variation of the wavefront-aberration-measuring interferometer of FIG. 10a;

FIG. 11b is a plan view of the second dual hole plate in the interferometer of FIG. 11a;

FIG. 14a is a plan view of a second embodiment of the first pinhole array plate, being a variation on the first embodiment of the first pinhole array plate of FIG. 13a;

FIG. 15b is a plan view of second Hartmann plate of the apparatus shown in FIG. 15a;

FIG. 16b is a plan view of the first pinhole cluster plate of the in interferometer of FIG. 16a;

FIG. 16c is a plan view of the second dual hole cluster plate of the in interferometer of FIG. 16a;

FIG. 20b is a cross-sectional diagram of the second pinhole mirror plate in the interferometer of FIG. 20a;

FIG. 21a is a plan view of the first pinhole array plate used in a variation of the interferometer of FIG. 20a;

FIG. 21b is a plan view of second pinhole mirror array plate 63 in a variation on interferometer 22Q shown in FIG. 20a;

FIG. 22 is a schematic optical diagram of an eighth wavefront-aberration-measuring interferometer that is a variation of the interferometer of FIG. 20a;

FIG. 24 is a flowchart indicating an exemplary method for calibrating the aspheric-surface-shape measuring interferometer of FIG. 7 using the wavefront-aberration-measuring interferometer FIG. 10a.

DETAILED DESCRIPTION OF THE INVENTION

The present invention relates to an interferometer system for measuring the shape of an aspheric surface of an optical element in an optical system and for measuring the wavefront aberration of such an optical system, particularly in connection with manufacture of a projection optical system suited to for use in an exposure apparatus employing soft-X-ray (EUV) exposure light.

Figure 3A:
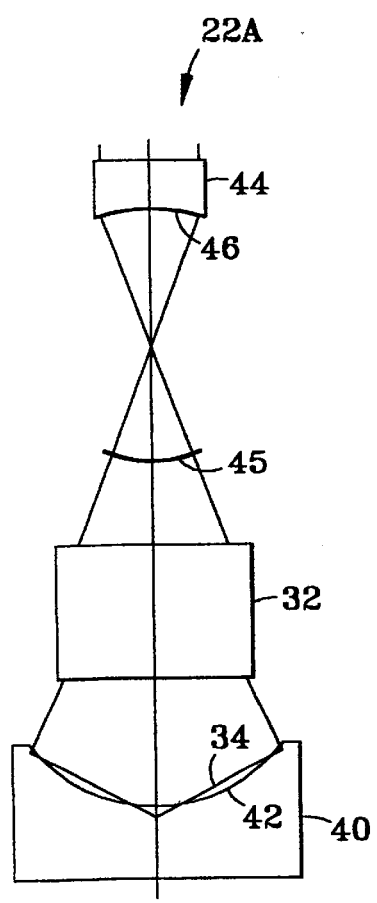
FIGS. 3a and 3b are schematic optical diagrams of first and second surface-shape-measuring interferometers of a first embodiment according to a first aspect of the present invention.
Figure 3B:
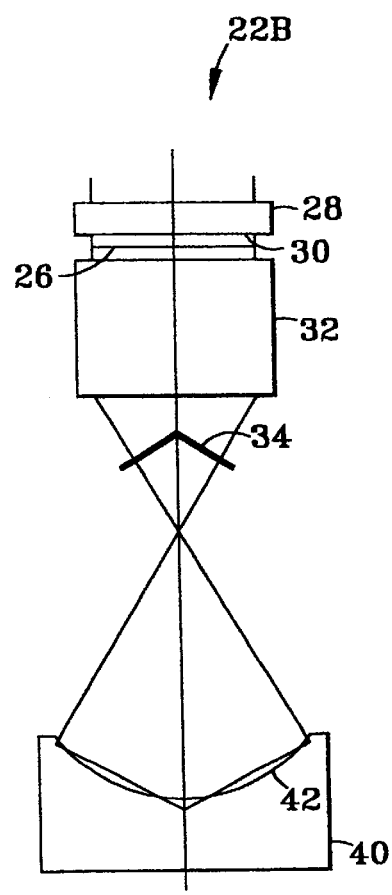

Referring to FIGS. 3a and 3b, the principle of operation of an interferometer system according to a first aspect of the present invention is now discussed.

Figure 1:
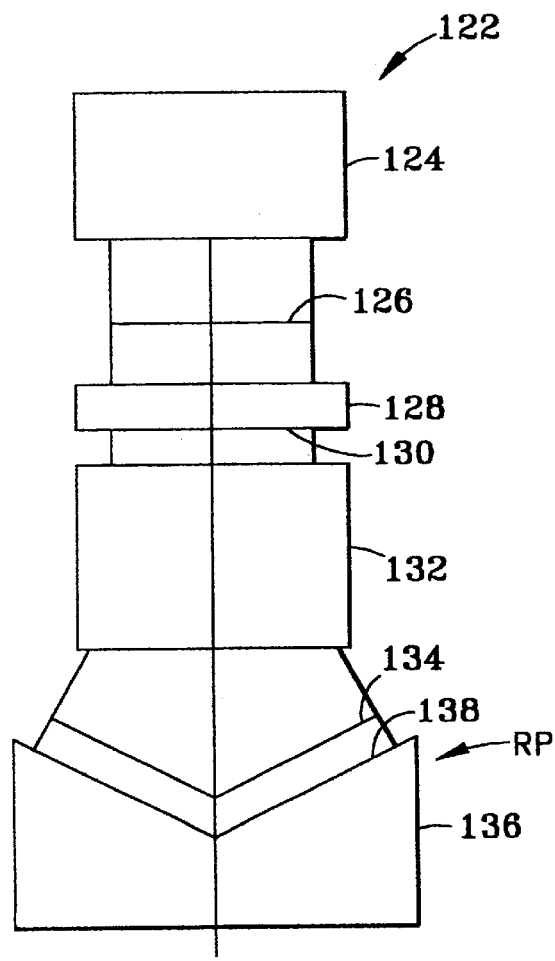
FIG. 1 is a schematic optical diagram of a first conventional surface-shape-measuring interferometer according to the prior art.

Compared with prior art interferometer 122 shown in FIG. 1, first and second interferometer systems 22A and 22B, shown in FIGS. 3a and 3b, respectively, according to the first aspect of the present invention have a reflective standard 40 with a separately and accurately calibrated spherical reflective surface 42 arranged in place of test surface (aspheric surface) 138 of test object 136 (see FIG. 1).

Interferometer 22A shown in FIG. 3a further differs from prior art interferometer 122 of FIG. 1 in that a wavefront 45 incident null element 32 is a spherical wavefront from a Fizeau lens 44, and in that a Fizeau surface 46 is used as the reference surface. Fizeau lens 42 need not be limited to a convergent system as shown, but may also be a divergent system.

Interferometer 22B shown in FIG. 3b is an example wherein a wavefront incident null element 32 is a plane wave 26, as in the case of prior art interferometer 122 shown in FIG. 1. A flat Fizeau surface 30 of a Fizeau lens 28 is used as the reference surface. Interferometer 22B differs from prior art interferometer 122 of FIG. 1 in that the light beam converted by null element 32 is a convergent light beam, and in that it permits measurement of concave surfaces as well as convex surfaces. A method of calibrating null wavefront in this case is to use a concave reflective surface to calibrate the wavefront as it diverges after having first converged and then to reverse calculate the shape of the null wavefront 34 at the position where it is actually used (heavy line in drawing) based on the calibrated wavefront shape. High-precision calibration is possible if a pinhole interferometer (i.e., a point diffraction interferometer, hereinafter referred to as a "PDI," discussed further below) is used to calibrate the concave reflective surface.

If the amount of asphericity of surface 42 is small, then the entire surface can be measured all at once. However, in the case of an aspheric surface that unfortunately generates interference fringes exceeding the resolution of the interferometer CCD, data for the entire surface can be obtained in the same manner by applying the so-called wavefront synthesis technique. This technique involves axially displacing reflective standard 40 relative to null wavefront 34, conducting interferometric measurements on a plurality of annular wavefront data, and joining the redundant regions of each of the data so they overlap without excess.

First Embodiment

Referring now to FIGS. 4a and 4b, third and fourth surface-shape-measuring interferometers 22C and 22D of a first embodiment according to a first aspect of the present invention are now described, wherein a PDI 52 employing an ideal spherical wavefront from a point light source 54 is used to measure null element 32 in Fizeau (aspheric-surface-measuring) interferometer (i.e., first interferometer system) 22A shown in FIG. 3a.

Interferometer 22C shown in FIG. 4a employs a divergent null element 32, and interferometer 22D shown in FIG. 4b employs a convergent null element 32. The latter is adopted when calibrating the wavefront 34 for measurement of a convex surface.

Since spherical wavefront 45 incident null element 32 in interferometers 22C and 22D of FIGS. 4a and 4b is an ideal spherical wavefront from a point light source 54, it is possible to simultaneously ascertain the shape of null wavefront 34 as well as the transmission characteristics of null element 32.

Second Embodiment

Figure 5A:
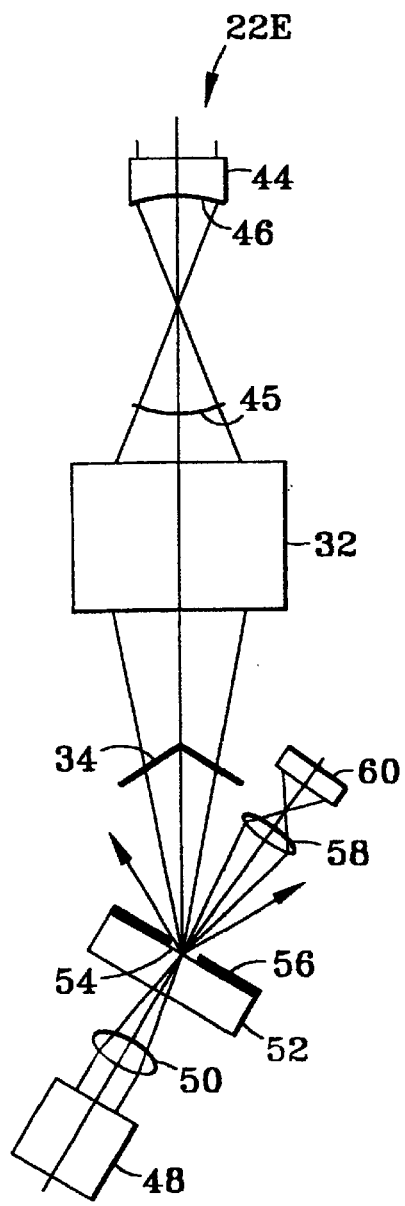
FIGS. 5a and 5b are schematic optical diagrams of fifth and sixth surface-shape-measuring interferometers of a second embodiment according to a first aspect of the present invention.
Figure 5B:
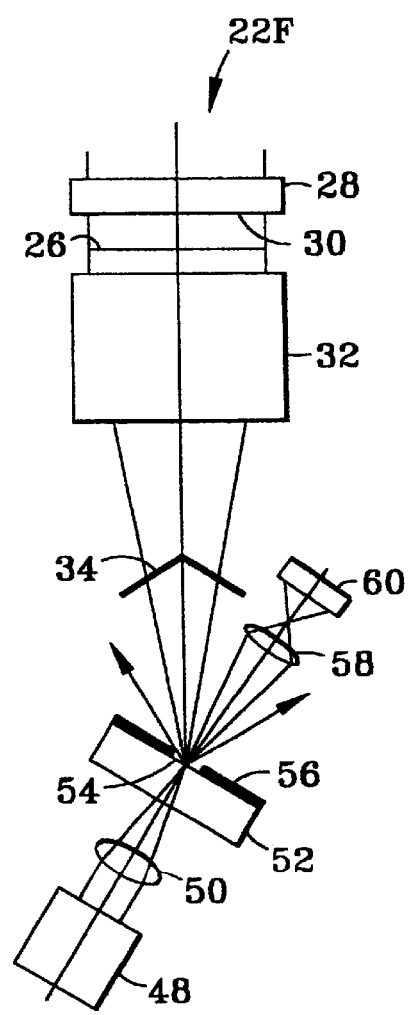

Referring now to FIGS. 5a and 5b, fifth and sixth surface-shape-measuring interferometers 22E and 22F of a second embodiment according to a first aspect of the present invention are used to measure null element 32 generating a convergent null wavefront 34, as the case at interferometer 22B shown in FIG. 3b. Interferometer 22E of FIG. 5a uses a spherical wavefront 45 as the wavefront from Fizeau surface 46 incident null element 32. Interferometer 22F in FIG. 5b uses a plane wave 26 therefor. It does not matter whether spherical wavefront 45 is a convergent light beam or a divergent light beam. Furthermore, use of PDI 52 replaces calibration using a reflective surface. PDI 52 corresponds to a point light source of the present invention.

To perform measurements with PDI 52, taking the case in which null wavefront 34 is convergent, pinhole 54 of PDI 52 is positioned so as to approximately coincide with the point of convergence of null wavefront 34. As a result, null wavefront 34, which is reflected from a reflective surface 56 surrounding pinhole 54, and the ideal spherical wavefront produced by the light leaving pinhole 54 will form interference fringes.

Third Embodiment

Figure 6:
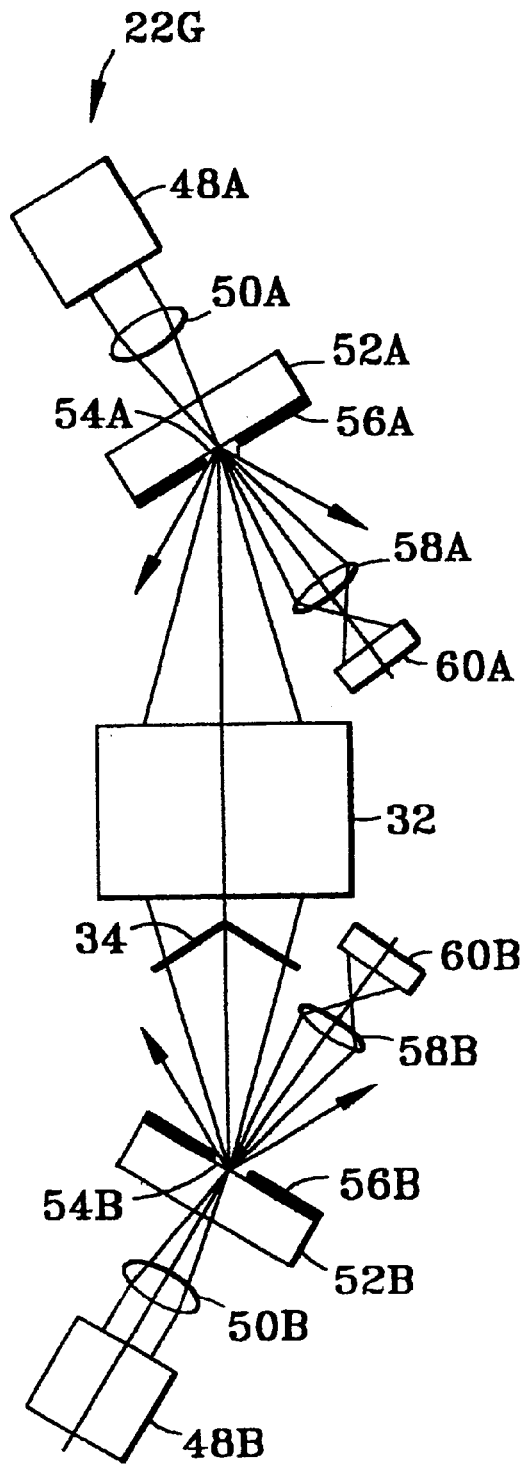
FIG. 6 is a schematic optical diagram of a seventh surface-shape-measuring interferometer of a third embodiment according to a first aspect of the present invention.

Referring now to FIG. 6. a seventh surface-shape-measuring interferometer 22G is a third embodiment according to a first aspect of the present invention and is similar to interferometer 22E of FIG. 5a, except that a PDIs 52A is used in place of a Fizeau lens 44 that there had generated a spherical wavefront. A second PDI 52B is also used for measurement light. In interferometer 22E and 22F shown in FIGS. 5a and 5b, respectively, there is a possibility that during operation of Fizeau interferometer 22E or 22F, the measurement light signal from PDI 52 will be lost in noise. In this case, it is preferable to in addition employ a polarizing element to reduce noise and improve the usable signal.

The measurement arrangement in interferometer 22G shown in FIG. 6 has the advantage that pinhole 54B that forms the point light source of second PDI 52B acts to reduce noise and improve the usable signal. This permits not only the shape of null wavefront 34 and the transmission characteristics of null element 32 to be accurately calibrated, but also permits the transmission characteristics of two PDIs 52A and 52B to be calibrated in both the forward and backward directions. Accordingly, accuracy can be further improved.

To actually use one of the aforementioned interferometers 22C–22G to measure a test surface 38 after calibration has thus been performed, reflective standard 40, point light source forming means, PDIs 52 or the like are removed and these are replaced with the original test surface 38 and a light source 48, following which measurements may be performed.

As described above, interferometers 22C–22G of the first through third embodiments according to a first aspect of the present invention make it possible to calibrate an aspheric null element 32 with high precision and in a short period of time.

Fourth Embodiment

Figure 7:
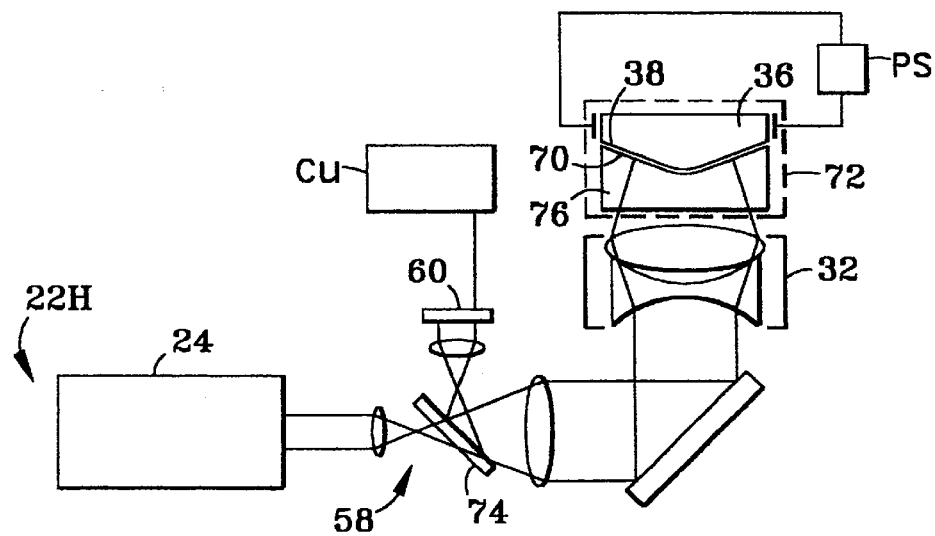
FIG. 7 is a schematic optical diagram of an eighth surface-shape-measuring interferometer of a fourth embodiment according to a second aspect of the present invention.
Figure 8A:
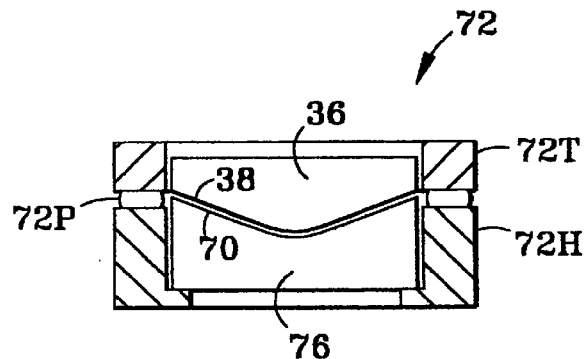
FIGS. 8a and 8b are cross-sectional diagrams of the main components of the holder assembly of the surface-shape-measuring interferometer of FIG. 7.
Figure 8B:
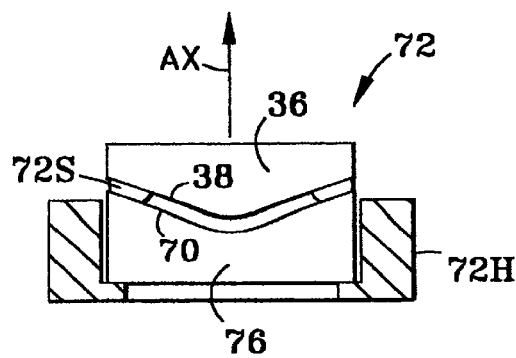

FIG. 7 shows an eighth surface-shape-measuring interferometer 22H of a fourth embodiment according to a second aspect of the present invention. FIGS. 8a and 8b show the principal parts of interferometer 22H of FIG. 7. Interferometer 22H shown in FIG. 7 is capable of measuring the shape of an aspheric surface.

Referring to FIG. 7, laser light from a laser 24 is changed into a collimated beam of a prescribed diameter by way of a lens system 58. and is then incident null element 32. Null element 32 emits a wavefront having a shape substantially identical to that of test surface 38, and the wavefront, having been converted to a prescribed aspheric surface shape, is incident in perpendicular fashion, an aspheric reference surface 70 and aspheric test surface 38. Furthermore, aspheric reference surface 70 has substantially the same shape as aspheric test surface 38 (with, however, concavity and convexity reversed). The light incident aspheric reference surface 70 is amplitude-divided, with one wavefront proceeding to test surface 38 and the other wavefront returning along the original optical path to serve as reference wavefront.

Aspheric reference surface 70 is arranged proximate test surface 38, and aspheric reference surface 70 and test surface 38 have mutually complementary shapes. Aspheric reference surface 70 and test surface 38 are supported in integral fashion by a holder 72.

Furthermore, light from aspheric reference surface 70 is reflected by test surface 38, and is again incident aspheric reference surface 70 as the measurement wavefront.

After the abovementioned reference wavefront and measurement wavefront exit from the reference optical element 76 upon which aspheric reference surface 70 is formed, they are incident null element 32, are reflected by a beam splitter 74 within lens system 58, and then form interference fringes on detector 60 comprising a CCD or other such image pickup element. By processing these interference fringes with a computer CU electronically connected to detector 60, the shape error of test surface 38 can be measured.

In interferometer 22H shown in FIG. 7, a main body, which includes the elements from laser 24 to null element 32, and holder 72, are supported by separate members so as to be spatially separated.

Figure 2:
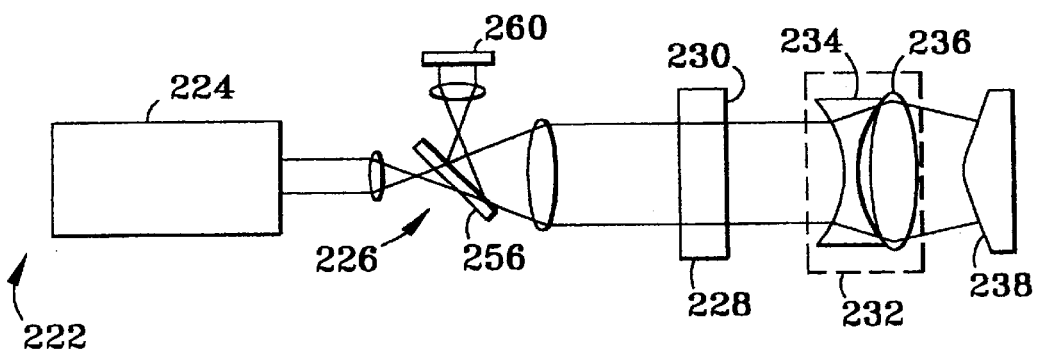
FIG. 2 is a schematic optical diagram of a second conventional surface-shape-measuring interferometer according to the prior art.

Interferometer 22H shown in FIG. 7 is basically a Fizeau interferometer, but it has several significant advantages over prior art Fizeau interferometer 222 of FIG. 2. The causes of the degradation in the measurement reproducibility in a conventional interferometer such as interferometer 122 of FIG. 1 or interferometer 222 of FIG. 2 include air fluctuations, vibration, sound, air pressure fluctuations, temperature fluctuations, detector noise, nonlinear errors and amplitude errors in the fringe scan, reproducibility of positioning the specimen, reproducibility of strain in the specimen due to the specimen holder, and aberrations in the optical system. Among these, air fluctuations, vibration, sound, air pressure fluctuations, temperature fluctuations, and optical system aberrations can be significantly reduced by bringing test surface 38 and reference surface 70 close together and physically joining them in integral fashion, as in interferometer 22H of the fourth embodiment of the present invention shown in FIG. 7.

Particularly with respect to interferometer 22H of in FIG. 7, while null element 32 is used therein, measurement accuracy is not affected by either the accuracy of null element 32 or the accuracy of alignment between null element 32 and test surface 38. This is because null element 32 functions to deliver a wavefront having an aspheric shape more or less identical to aspheric reference surface 70 to that aspheric reference surface 70, but does not directly function to deliver an aspherically shaped wavefront to test surface 38. Accordingly, although null element 32 is not an essential component in interferometer 22H, it is preferable to use null element 32 so as to improve measurement accuracy.

The positional reproducibility of test object 36 in interferometer 22H is ensured through use of a position sensor PS (electronic micrometer or the like), not shown, arranged around test object 36, and the reproducibility of strain in the test specimen 36 from the specimen holder 72 is improved by constructing the specimen holder 72 such that support is effected in three-point or multi-point fashion.

In addition, the close proximity of test surface 38 and reference surface 70 makes detection of alignment error easier and enables high-precision alignment. Detector noise can be sufficiently reduced by cooling detector 60 and by integrating the data. Nonlinear errors and amplitude errors during fringe scans can be eliminated by using a digital-readout piezoelectric element, and by processing the signal such that there are an increased number of packets during fringe scans. Adoption of the above-described constitution in interferometer 22H permits attainment of repeatabilities of 0.05 nm RMS or better, and permits attainment of measurement reproducibilities, including alignment error, changes occurring over time, and so forth, of 0.1 nm RMS or better.

A remaining problem with interferometer 22H is absolute accuracy, which is dependant on the surface accuracy of reference aspheric surface 70. This error is a systematic error associated with the interferometer 22H. Below are described ways to correct this error (i.e., how calibration to offset this error.

Interferometer 22H, while based on conventional Fizeau interferometer 222 shown in FIG. 2, is different from the conventional Fizeau interferometer in the following respects. Fizeau (reference) surface 70 of interferometer 22H is an aspheric surface, its shape being such that convexity and concavity are reversed with respect to test surface 38 arranged in close proximity to Fizeau surface 70. The constitution is such that reference element 76 is separated from the optical system, and such that the (Fizeau) reference optical element 76 is physically connected in integral fashion to test object 36. This constitution significantly improves repeatability and measurement reproducibility as compared with that of above-described conventional interferometer 222 shown in FIG. 2.

FIGS. 8a and 8b show two exemplary configurations for holder assembly 72 of interferometer 22H of FIG. 7. FIG. 8a shows an exemplary configuration wherein the spacing between test surface 38 and aspheric reference surface 70 is variable, and FIG. 8b shows an exemplary configuration wherein the spacing is fixed.

Referring to FIG. 8a, reference element 76 with aspheric reference surface 70 is held by reference element holder 72H, which is disposed separately from the interferometer 22H main body. A piezoelectric element 72P is provided on reference element holder 72H. A test object holder 72T, which holds test object 36, is mounted to reference element holder 72H by way of piezoelectric element 72P. By driving piezoelectric element 72P, the spacing between aspheric reference surface 70 and test surface 38 can be adjusted. Furthermore, this variable spacing can also be exploited to perform a fringe scan, which is a conventional method of analyzing interference fringes.

The exemplary configuration of holder assembly 72 shown in FIG. 8b is similar to the exemplary configuration shown in FIG. 8a in that reference element 76 with aspheric reference surface 70 is held by reference element holder 72H. However, holder assembly 72 of FIG. 8b has spacers 72S directly vacuum-deposited at three locations on aspheric reference surface 70. Spacers 72S are 1 to 3 $\mu$m in thickness, this thickness being identical at all three locations. Furthermore, spacers 72S are provided so that they trisect the circumference about an axis Ax in the vertical direction of the paper surface in FIG. 8b. Test surface 38 is mounted on (three) spacers 72S. The spacing between aspheric reference surface 70 and test surface 38 can thereby be kept constant and the strain in test surface 38 due to gravity can also be kept constant. If the exemplary configuration shown in FIG. 8b is employed, it is possible to perform a fringe scan for analyzing interference fringes by varying laser wavelength, which has the additional benefit of eliminating the likelihood that the interferometer will be affected by mechanical vibration or the like.

It is preferable that test object 36 be held in holder assembly 72 in the same manner as it is held in the optical system of which it is an optical component. It is also preferable that test object 36 be held in holder assembly 72 in the same orientation with respect to gravity as it is held in the optical system of which it is an optical component. This will make it possible to carry out meaningful measurements despite changes in surface shape which may occur due to the action of strain on test surface 38 when test object 36 is actually incorporated into an optical system.

It is also preferable to make the spacing between aspheric reference surface 70 and test surface 38 less than 1 mm. If this spacing exceeds 1 mm, the impact of air fluctuations, vibration, sound, air pressure fluctuations, temperature fluctuations and optical system aberrations increases, leading to a deterioration in measurement accuracy. To further improve measurement accuracy, it is preferable to set the spacing between aspheric reference surface 70 and test surface 38 to be less than 100 $\mu$m.

In addition, if the spacing between aspheric reference surface 70 and test surface 38 is fixed as in FIG. 8b, it is preferable to set this spacing to be less than 10 $\mu$m.

Variation on Fourth Embodiment

In the exemplary configuration shown in FIG. 8a and discussed above, the spacing between test surface 38 and aspheric reference surface 70 may be detected by the following techniques.

Figure 9:
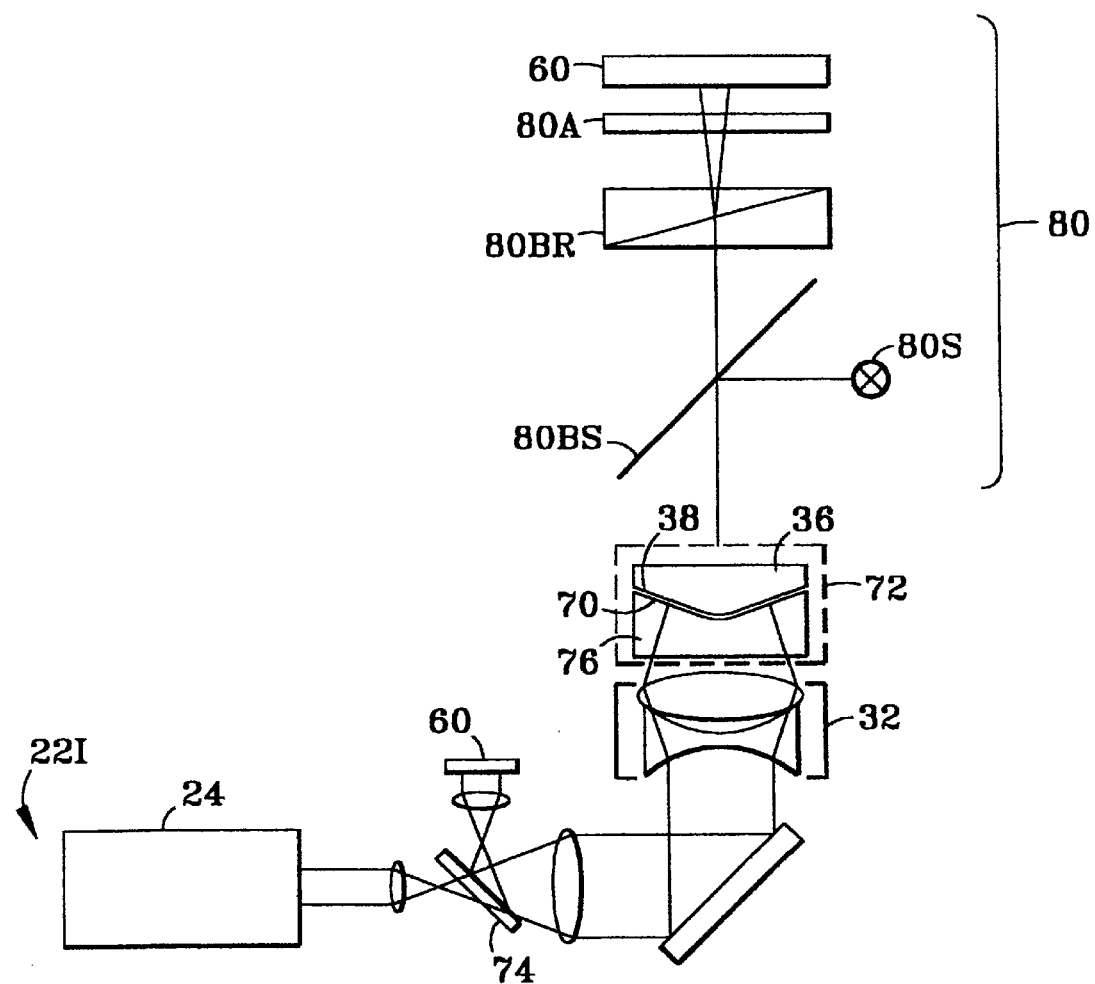
FIG. 9 is a schematic optical diagram of a ninth surface-shape-measuring interferometer that is a variation of the surface-shape-measuring interferometer of FIG. 7.

Referring now also to FIG. 9, a ninth surface-shape-measuring interferometer 22I is a variation on the above-described interferometer 22H of the fourth embodiment shown in FIG. 7. In interferometer 22I, elements similar in function to those in interferometer 22H have been given the same reference numerals and so a description thereof is omitted.

Interferometer 22I shown in FIG. 9 differs from interferometer 22H shown in FIG. 7 in that a shearing interferometer 80 is provided behind test surface 38 (i.e., at the side opposite from aspheric reference surface 70). Shearing interferometer 80 guides light from a white light source 80S to test surface 38 and aspheric reference surface 70 by way of a beam splitter 80BS. Light reflected by test surface 38 and light reflected by aspheric reference surface 70 passes through beam splitter 80BS, and is horizontally displaced by a birefringent member 80BR. The latter may be, for example, a Wollaston prism. The light then passes through an analyzer 80A and forms an interference pattern on detector 60, such as a CCD. The spacing between test surface 38 and aspheric reference surface 70 can be detected by monitoring the change in the interference pattern on detector 60. In addition, in interferometer 22I shown in FIG. 9, optical element 36 having test surface 38 is preferably made of an optically transmissive material such as, for example, quartz or Zerodur.

Fifth Embodiment

Figure 10A:
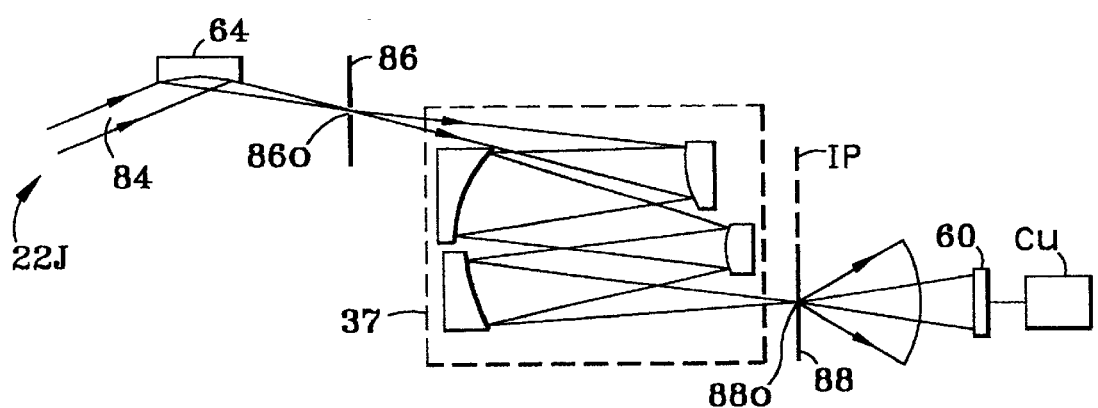
FIG. 10a is a schematic optical diagram of a first wavefront-aberration-measuring interferometer for explaining the principle of a fifth embodiment according to a third aspect of the present invention.

Referring now to FIGS. 10a–14, we describe a fifth embodiment according to a third aspect of the present invention. FIGS. 10a and 11a show first and second wavefront-aberration-measuring interferometers 22J and 22K. FIGS. 12–14b show exemplary configurations of a third wavefront-aberration-measuring interferometer 22L according to the fifth embodiment.

Figure 11A:
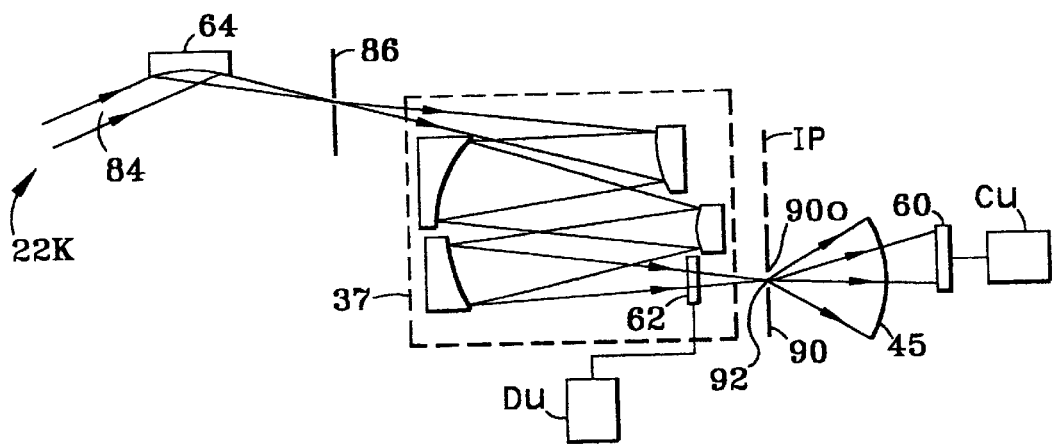
Figure 12:
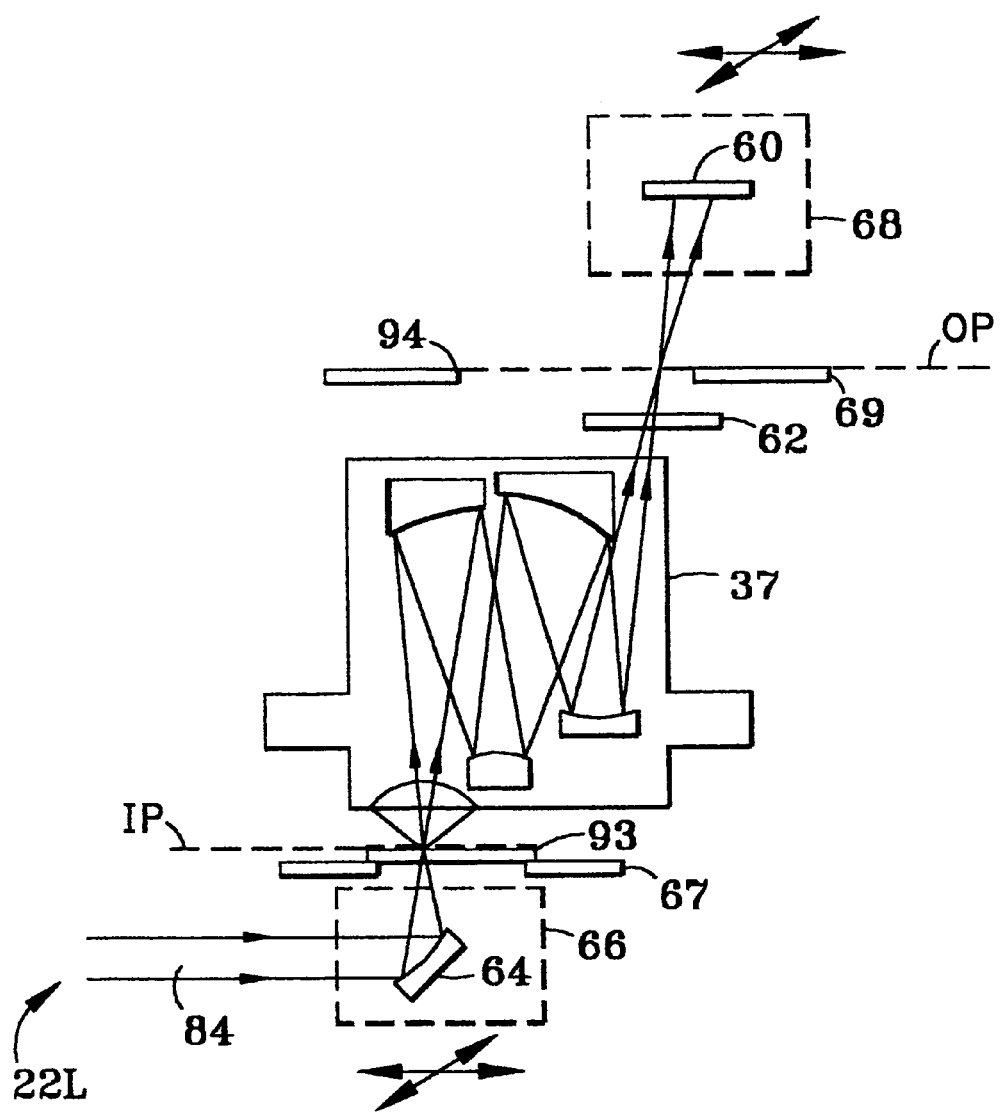
FIG. 12 is a schematic optical diagram of a third wavefront-aberration-measuring interferometer of a fifth embodiment according to a third aspect of the present invention.

Interferometers 22J, 22K, and 22L, respectively shown in FIGS. 10a, 11a, and 12, are not "Fizeau" aspheric-surface-shape-measuring interferometers for measuring the surface shape of a test surface 38 of a test object 36 previously removed from an optical system of which it is an optical component, as were interferometers 122, 222, and 22A–22I shown in FIGS. 1–9. Rather, they are wavefront-aberration-measuring interferometers for measuring the wavefront aberration produced by an optical system. Note that for the sake of convenience, the term "interferometer" is used to refer to either an aspheric-surface-shape-measuring interferometer, a wavefront-aberration-measuring interferometer, or to both, when the meaning is clear from context.

The wavefront-aberration-measuring interferometers 22J–22L according to the fifth embodiment of the present invention use light corresponding to an exposure wavelength in the soft X-ray region to measure wavefront aberration of a projection optical system.

Referring to FIGS. 10a–11c, the principle of the wavefront-aberration-measuring interferometer of the fifth embodiment according to a second aspect of the present invention is now described.

With reference to FIG. 10a, light from a synchrotron orbital radiation (hereinafter "SOR") undulator (not shown) passes through a spectroscope (not shown) to form quasi-monochromatic light 84 having a wavelength around 13 nm. Light 84 is condensed by a condenser mirror 64 and is incident a first pinhole plate 86. First pinhole plate 86 has an aperture (pinhole) 86o of a size smaller than the size of the Airy disk as determined from the numerical aperture on the incident side (first pinhole plate 86 side) of an optical system 37 under test. The size of the Airy disk is given by 0.6 λ/NA, where NA is the incident-side numerical aperture of optical system 37, and λ is the wavelength of quasimonochromatic light 84.

Light having a wavefront which can be regarded as that of an ideal spherical wavefront will exit first pinhole plate 86. Light from first pinhole plate 86 is then incident optical system 37, and then arrives at a pinhole plate 88 having an aperture 88o arranged at an image plane IP of optical system 37. First pinhole plate 86 and second pinhole plate 88 are arranged at locations made mutually conjugate by optical system 37, i.e., at locations corresponding to what would be an object point and an image point if optical system 37 were actually used to image an object.

Figure 10B:
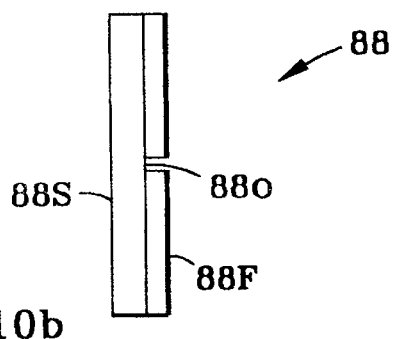

Referring to FIG. 10b, pinhole plate 88 comprises a semitransparent film 88F provided on a substrate 88S which is optically transmissive at the wavelength of emitted quasi-monochromatic light 84, and aperture 88o wherein semitransparent film 88F is not provided. Accordingly, a portion of the wavefront incident pinhole plate 88 is transmitted without alteration of the wavefront, and another portion undergoes diffraction at aperture 88o. Accordingly, if the size of aperture 88o is sufficiently small, the light diffracted at aperture 88o can be regarded as an ideal spherical wavefront.

Referring again to FIG. 10a, detector 60 is arranged on the exit side of pinhole plate 88 (i.e., at the side thereof opposite from optical system 37). Interference fringes are formed on detector 60 due to interference between the ideal spherical wavefront from aperture 88o and the transmitted wavefront from semitransparent film 88F. The transmitted wavefront from semitransparent film 88F corresponds in shape to the wavefront aberration of optical system 37. The interference fringes on detector 60 assume a shape corresponding to the deviation of this transmitted wavefront from an ideal spherical wavefront (ie., the wavefront from aperture 88o). Accordingly, the wavefront aberration of optical system 37 can be determined by analyzing, in a computer CU electrically connected to detector 60, the interference fringes detected by detector 60.

FIG. 11a is a fourth wavefront-aberration-measuring interferometer 22K employing an SOR undulator light source and which is a variation of wavefront-aberration-measuring interferometer 22J of FIG. 10a. Note that in FIGS. 11a–11c, elements similar in function to elements appearing in FIGS. 10a and 10b are given the same reference numerals as in FIGS. 10a and 10b. Interferometer 22K makes use of a measurement technique of higher precision than that of interferometer 22J. Interferometer 22K in FIG. 11a differs from interferometer 22J in FIG. 10a in that a second dual hole plate 90 is arranged in place of second pinhole plate 88, and a diffraction grating 62 is inserted between first pinhole plate 86 and second dual hole plate 90.

Figure 11B:
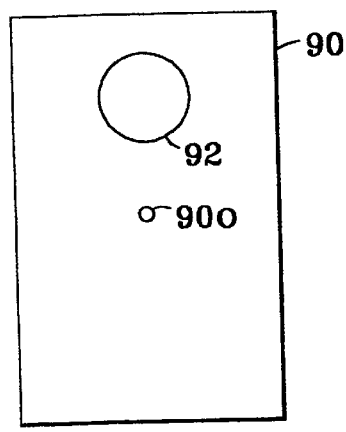
Figure 11C:
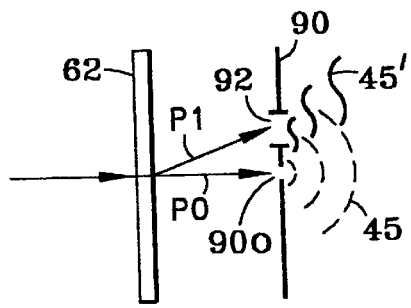
FIG. 11c is a cross-sectional diagram explaining the operation of the second dual hole plate in the interferometer of FIGS. 11a and 11b.

FIG. 11b shows the constitution of second dual hole plate 90, and FIG. 11c is a diagram for explaining the functions of diffraction grating 62 and second dual hole plate 90. Referring to FIG. 11b, second dual hole plate 90 has microscopic aperture 90o that functions as a pinhole, and an aperture 92 that is larger than pinhole 90o. Pinhole 90o and aperture 92 are formed such that if second dual hole plate 90 is at the location of image plane IP of optical system 37, pinhole 90o is positioned in the optical path of the zeroeth-order peak P0 of the diffraction pattern produced by diffraction grating 62. In addition, aperture 92 is positioned in the optical path of a first-order peak P1 of the diffraction pattern produced by diffraction grating 62, as shown in FIG. 11c.

Accordingly, zeroeth-order peak P0 is diffracted by pinhole 90o, forming an ideal spherical wavefront 45 which then proceeds to detector 60. In addition, a wavefront 45' associated with first-order peak P1, which contains information about the wavefront aberration of optical system 37, passes through aperture 92 without alteration, and proceeds to detector 60. At this time, zeroeth-order peak P0 and first-order peak P1 have wavefronts 45 and 45', respectively, corresponding to the wavefront aberration of optical system 37. Wavefront 45 of the light that passes through pinhole 90o, is converted to an ideal spherical wavefront. However, wavefront 45' passing through aperture 92 does not undergo any significant amount of diffraction, and so has a wavefront shape corresponding to the wavefront aberration of optical system 37. Accordingly, interference fringes due to interference between ideal spherical wavefront 45 from pinhole 90o and measurement wavefront 45 from aperture 92 are formed on detector 60. The profile of the interference fringes formed on detector 60 will correspond to the deviation of the measurement wave from an ideal spherical wavefront 45, and wavefront 45' containing aberration information of optical system 37 can be determined by analyzing these interference fringes, as in the case for interferometer 22J of FIG. 10a.

With continuing reference to FIG. 11a, a fringe scan for high-precision measurement can be performed by moving diffraction grating 62 by operatively connecting the latter to a diffraction grating driving unit DU. In interferometer 22K, diffraction grating 62 is shown arranged in the optical path between optical system 37 and second dual hole plate 90. However, diffraction grating 62 may be arranged in the optical path anywhere between first pinhole plate 86 and second dual hole plate 90. For example, it is possible to arrange diffraction grating 62 in the optical path between first pinhole plate 86 and optical system 37. In addition, while the above-described embodiment of interferometer 22K employed two diffraction orders P0 and P1 of the diffraction pattern produced by diffraction grating 62. the present invention is not limited to two such orders or of combinations of the zeroeth-order and first-order.

Referring now to FIG. 12, a fifth wavefront-aberration-measuring interferometer 22L, which represents a fifth embodiment according to the second aspect of the present invention for measuring the wavefront aberration of an optical system 37 based on the principle explained above with reference to FIGS. 10a–11c, is now described. In FIG. 12, elements similar in function to elements appearing in FIGS. 10a–11c are given the same reference numerals as in FIGS. 10a and 10b.

In interferometers 22J and 22K shown in FIGS. 10a and 11a, the aberration of optical system 37 can only be measured at one point in image plane IP. To accurately ascertain the aberration of an optical system, it is necessary to measure a plurality of image points. To measure a plurality of image points in interferometers 22J and 22K, one conceivable method of performing measurements would involve moving first pinhole plate 86 and second pinhole plate 88, or second dual hole plate 90, to a number of prescribed positions. In this case, since the pinholes are extremely small, there is a risk that the pinholes will be affected by the vibration of the movement mechanism that moves the pinholes, and that particularly for pinholes on the image side, it will not be possible to make light pass through these pinholes stably. This makes good measurements extremely problematic. In addition, if pinholes are moved, it becomes difficult to measure the pinhole positions with good accuracy. Further, there is a risk that the accuracy with which aberration (particularly distortion), is measured will no longer be sufficient, particularly for image points.

In interferometer 22L, a first pinhole array plate 93, wherein pinholes are arrayed in two dimensions, is used in place of first pinhole plate 86 of interferometer 22K shown in FIG. 11a.

Referring to FIG. 12, light from an SOR undulator (not shown) passes through an analyzer (not shown) to form quasimonochromatic light 84 having of wavelength around 13 nm. This light is condensed by condenser mirror 64 and is incident first pinhole array plate 93. Unlike wavefront-aberration-measuring interferometers 22J and 22K shown in FIGS. 10a and 11a, interferometer 22L shown in FIG. 12 is constituted such that light is incident the image plane IP side, not the object plane OP side, of optical system 37, the reason for which is discussed below.

Figure 13A:
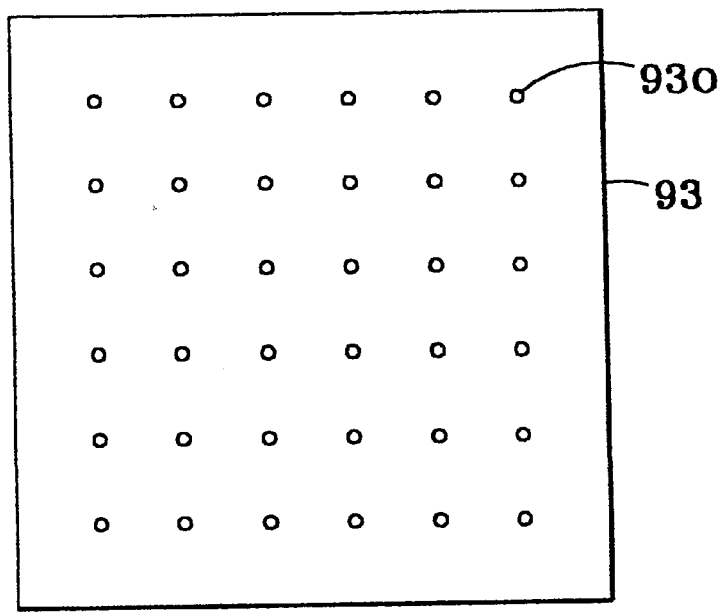
FIG. 13a is a plan view of a first embodiment of the first pinhole array plate of the interferometer of FIG. 12.

Turning briefly to FIG. 13a, first pinhole array plate 93 comprises an array or matrix of pinhole apertures (pinholes) 93o of a size well smaller than the size of the Airy disk 0.6 $\lambda$/NA, as determined from the numerical aperture (imagewise numerical aperture) NA at the incident side of optical system 37. The positions of pinholes 93o correspond to the locations of image points of optical system 37 for which measurement of wavefront aberration is desired.

Returning now to FIG. 12, condenser mirror 64 is provided on a condenser mirror stage 66, which is capable of movement parallel to image plane IP of optical system 37. By moving condenser mirror stage 66, any desired pinhole 93o on first pinhole array plate 93 can be selectively illuminated. An illuminated pinhole 93o corresponds to a measurement point. Furthermore, the position at which quasimonochromatic light 84 is incident first pinhole array plate 93 will change with the movement of condenser mirror stage 66. In addition, it is also possible to collectively illuminate a plurality of pinholes 93o on first pinhole array plate 93 instead of, or in addition to, illuminating just one of the pinholes. Nonetheless, in the description below, it is assumed for the sake of convenience, that only one pinhole 93o is illuminated.

Figure 13B:
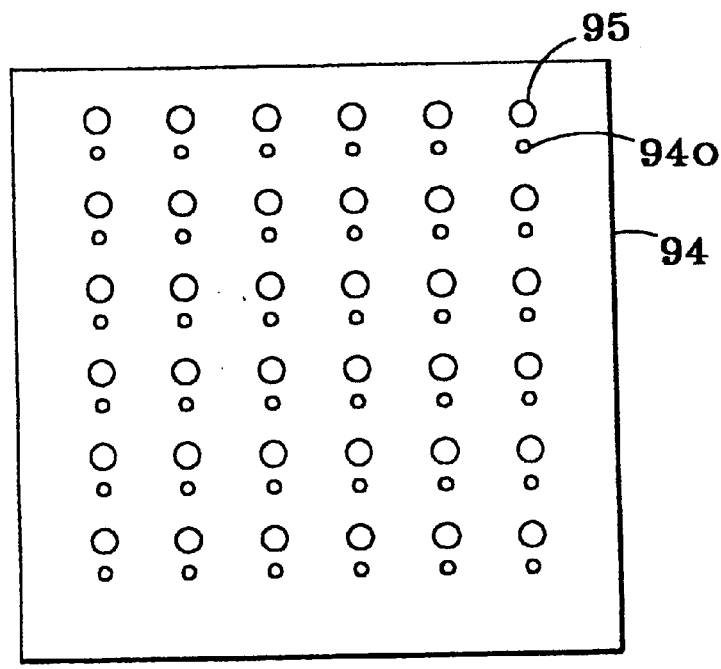
FIG. 13b is a plan view of a first embodiment of the second dual hole array plate of the interferometer of FIG. 12.

Referring now also to FIG. 13b, second dual hole array plate 94 is located in object plane OP, ie., arranged at the position at which optical system 37 images first pinhole array plate 93. Second dual hole array plate 94 has a plurality of pinhole apertures (pinholes) 94o provided in a matrix at positions at which the plurality of pinholes 93o of first pinhole array plate 93 are imaged, and a plurality of apertures 95 provided in a matrix such that each is separated by a prescribed distance from each of the plurality of pinholes 94o. Furthermore, each of the plurality of pinholes 94o has the same function as pinholes 90o in FIG. 11b, and each of the plurality of apertures 95 has the same function as aperture 92 in FIG. 11b.

Referring again to FIG. 12, light having a wavefront 45, which can be regarded as that of an ideal spherical wavefront, exits an illuminated pinhole 93o, and is incident optical system 37. This light passes through optical system 37 and is diffracted by diffraction grating 62 arranged between optical system 37 and object plane IP. Zeroeth-order peak P0 (not shown in FIG. 12) of the diffraction pattern arrives at pinhole 94o on second dual hole array plate 94 corresponding to the illuminated pinhole 93o on first pinhole array plate 93. First-order peak P1 (not shown on FIG. 12) of the diffraction pattern arrives at aperture 94o on second dual hole array plate 94 corresponding to the illuminated pinhole 93o on first pinhole array plate 93. Light that passes through pinhole 94o and the light that passes through aperture 95 mutually interfere.

With continuing reference to FIG. 12, detector 60, is attached to a detector stage 68 which is capable of movement parallel to object plane OP, is arranged at the exit side of second dual hole array plate 94. Detector stage 68 is constituted so that it is linked with and moves with condenser mirror stage 66, and such that only pinhole 94o and apertures 95, corresponding to illuminated pinhole 93o, can be seen from detector 60. Accordingly, the interference fringes due to the light only from pinhole 94o and aperture 95, corresponding to the illuminated pinhole 93o, are formed on detector 60. By analyzing these interference fringes, the wavefront aberration at image plane IP location corresponding to illuminated pinhole 93o can be determined.

In interferometer 22L of FIG. 12, first pinhole array plate 93 and second dual hole array plate 94 are physically grounded (i.e., secured so as to be stationary) with respect to optical system 37. Thus, stable measurements can be performed without being affected by vibrations caused by the movement of stages 66, 68 during actual measurements.

First pinhole array plate 93 is mounted on a vertical stage 67, which is capable of causing first pinhole array plate 93 to move in jogged (i.e., incremental) fashion in a direction parallel to the optical axis of optical system 37. Vertical stage 67 is preferably secured to the same frame (not shown) that supports optical system 37. In addition, second dual hole array plate 94 is mounted on an XY stage 69, which is capable of causing second dual hole array plate 94 to move in jogged fashion within object plane OP of optical system 37. XY stage 69 is attached to the abovementioned frame by way of a piezoelectric element. Adjustment of focus can be performed by using vertical stage 67 to move first pinhole array plate 93. If there is distortion in optical system 37, XY stage 69 can be used to align the position of pinhole 94o. Furthermore, a length measuring interferometer or other such microdisplacement sensor (not shown) may be provided on XY stage 69, permitting distortion in optical system 37 to be measured based on the output from the microdisplacement sensor. Furthermore, in the present embodiment, the positions of the plurality of pinholes 93o of first pinhole array plate 93 and the plurality of pinholes 94o of second dual hole array plate 94 are accurately measured beforehand using a coordinate measuring interferometer.

Although the position of pinhole 94o is moved in interferometer 22L, this pinhole can be positioned with good accuracy since the stroke of this movement is small. Furthermore, interferometer 22L is constituted such that pinhole 94o, on the object plane OP side of optical system 37 is moved when optical system 37 has a reduction magnification of $-1/\beta$. Thus, the positioning accuracy of pinhole 94o can be relaxed by the factor $|-1/\beta|$ as compared with the case in which pinhole 93o, on the image plane IP side of optical system 37, is moved.

Interferometer 22L is not constituted so that pinhole 93o is moved and the amount of movement of pinhole 94o is in a range wherein positioning accuracy can be maintained. Thus, stable measurement can be achieved, and the measurement accuracy of aberration, particularly distortion, at the imaged location can be made sufficient.

Figure 14A:
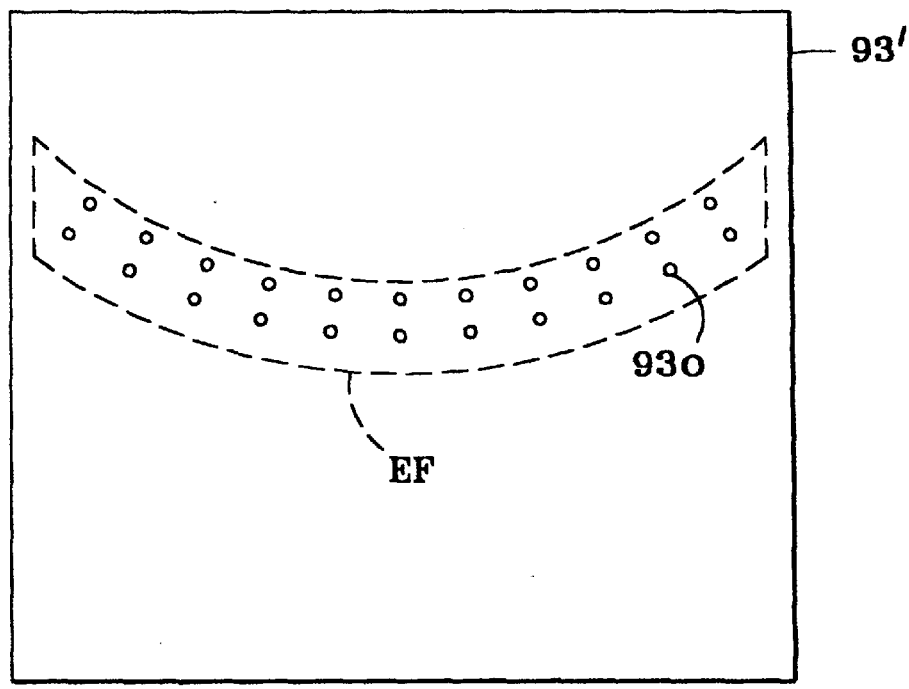
Figure 14B:
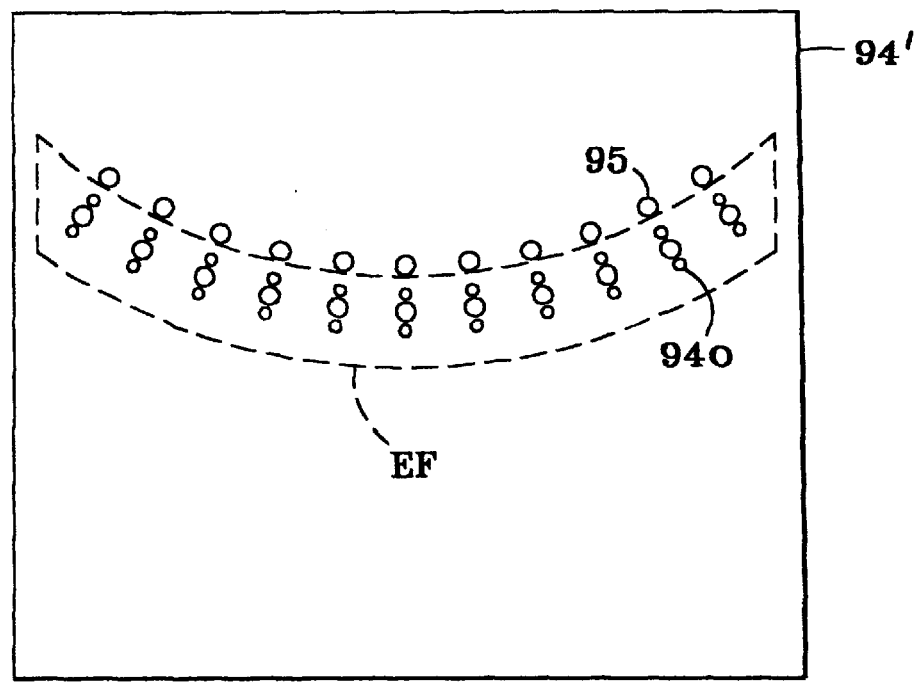
FIG. 14b is a plan view of a second embodiment of the second dual hole array plate, being a variation on the first embodiment of the second dual hole array plate of FIG. 13b.

In interferometer 22L shown in FIG. 12, the plurality of pinholes 93o corresponding to positions for measurement of the wavefront aberration of optical system 37 are shown arranged in a matrix. However, the arrangement of pinholes 93o is not limited to a typical square or rectangular matrix. For example, referring to FIG. 14a, if the field (exposure field) EF of optical system 37 is arcuate, as shown in FIGS. 14a and 14b, then a pinhole plate 93' having pinholes 93o may be arranged with a prescribed spacing at an object height (image height) of the same height as that of optical system 37. Also, as shown in FIG. 14b, the arrangement of the pinholes 94o and apertures 95 in second dual hole array plate 94' will have to be prealigned with pinholes 93o of the first pinhole array plate 93.

While diffraction grating 62 in interferometer 22L of FIG. 12 is arranged in the optical path between optical system 37 and second dual hole array plate 94, diffraction grating 62 may also be arranged in the optical path between first pinhole array plate 93 and second dual hole array plate 94. For example, it is possible for diffraction grating 62 to be arranged between first pinhole array plate 93 and optical system 37. In addition, while interferometer 22L shown in FIG. 12 employs two peaks of the diffraction pattern produced by diffraction grating 62, i.e., zeroeth-order peak P0 of the diffraction pattern and first-order peak P1 of the diffraction pattern, the present invention is not limited to employment of two such peaks, or of employment of combinations of zeroeth-order and first-order peaks.

Sixth Embodiment

Figure 15A:
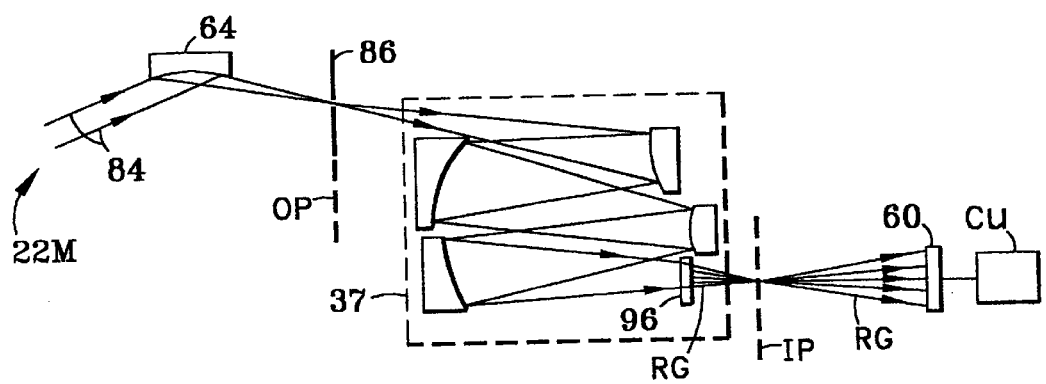
FIG. 15a is a schematic optical diagram of fourth wavefront-aberration-measuring apparatus of a sixth embodiment according to the present invention.
Figure 15B:
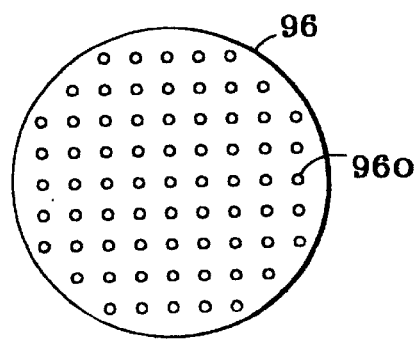

Referring now to FIGS. 15a and 15b, a fourth wavefront-aberration-measuring apparatus 22M of a sixth embodiment according to the present invention is now described. Apparatus 22M uses a soft X-ray exposure wavelength to measure the wavefront aberration of an optical system 37. Note that in FIGS. 15a and 15b, elements similar in function to elements appearing in FIGS. 10a–14b are given the same reference numerals as in FIGS. 10a–14b.

Referring to FIG. 15a, light from an SOR undulator (not shown) passes through an analyzer (not shown) to form quasimonochromatic light 84 having a wavelength around 13 nm, which is condensed by a condenser mirror 64 and is incident first pinhole plate 86. First pinhole plate 86 has an aperture of a size well smaller than the size of the Airy disk, 0.6 $\lambda$/NA, where $\lambda$ is the wavelength of quasimonochromatic light 84 and NA is the numerical aperture on the incident side (first pinhole plate 86 side) of optical system 37. Accordingly, the light that exits first pinhole plate 86 can be regarded as having the wavefront of an ideal spherical wavefront.

In apparatus 22M, a second Hartmann plate 96 having a plurality of apertures 96o, as shown in FIG. 15b, is arranged between the location of image plane IP of optical system 37 (a location made conjugate to first pinhole plate 86 by optical system 37) and optical system 37.

Returning to FIG. 15a, the light beam from first pinhole plate 86, upon exiting optical system 37, forms, due to the action of the plurality of apertures 96o of second Hartmann plate 96, a plurality of ray groups RG that are the same in number as the number of apertures 96o. Ray groups RG then proceed to image plane IP of optical system 37. Ray groups RG converge at image plane IP of optical system under test 37 and arrive at detector 60 in a divergent state. If the plane of the pupil (not shown) of optical system under test 37 is subdivided into a plurality of sections, ray groups RG that pass through the plurality of apertures 96o on second Hartmann plate 96 respectively correspond to rays passing through each such pupil section. As a result, the lateral aberration of optical system 37 can be determined if the position at which each of ray groups RG arrives at detector 60 is detected. The wavefront aberration of optical system 37 can be determined from this lateral aberration.

In apparatus 22M, the plurality of apertures 96o provided on second Hartmann plate 96 are arranged in a matrix as shown in FIG. 15b. However, the present invention is not limited to this arrangement. In addition, while in apparatus 22M second Hartmann plate 96 is arranged between optical system 37 and image plane IP second Hartmann plate 96 may also be located between first pinhole plate 86 and image plane IP, it being possible, for example, for second Hartmann plate 96 to be arranged in the optical path between first pinhole plate 86 and optical system 37.

Seventh Embodiment

Figure 16A:
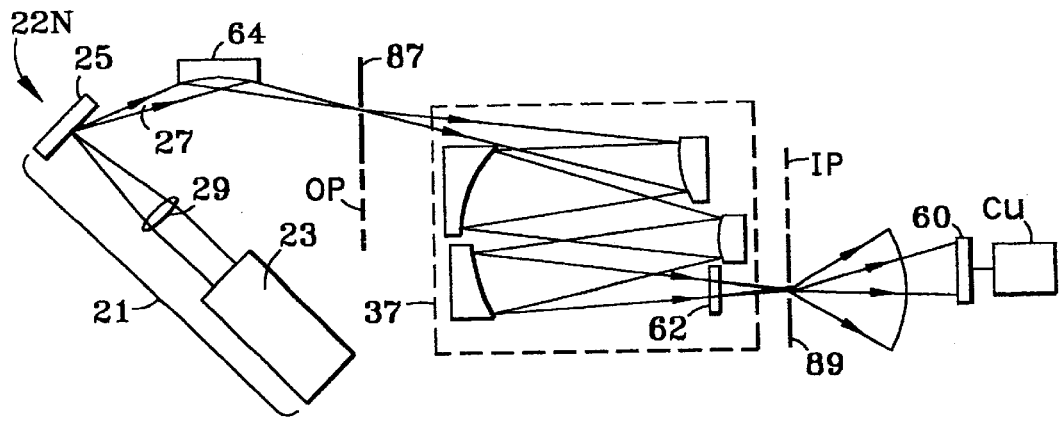
FIG. 16a is a schematic optical diagram of a fifth wavefront-aberration-measuring interferometer of a seventh embodiment according to a third aspect of the present invention.
Figure 16B:
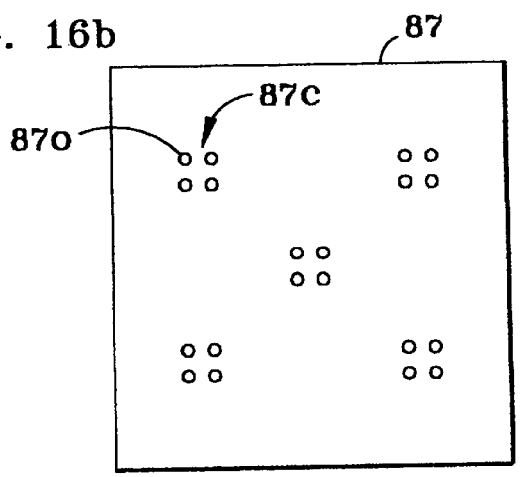
Figure 16C:
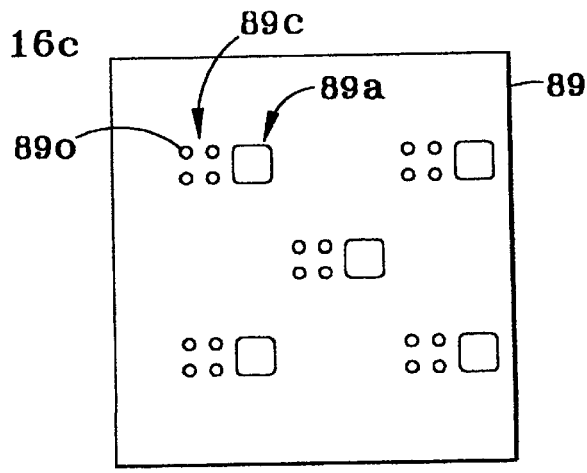

Referring now to FIGS. 16a–16c, a fifth wavefront-aberration-measuring interferometer 22N of a seventh embodiment according to a third aspect of the present invention is described. Interferometers 22J, 22K, 22L, and 22M of the fifth and sixth embodiments discussed above are wavefront-aberration-measuring interferometers which employ an SOR undulator (not shown) as a light source. Although accuracy can be made extremely high if an SOR undulator is used as a light source, the apparatus itself becomes excessively large, and it is generally extremely difficult to use in a factory. Thus, referring to FIG. 16a, in interferometer 22N discussed in further detail below, a laser plasma X-ray (hereinafter "LPX") source 21 is used in place of an SOR undulator as light source. LPX source 21 generates high-temperature plasma from a target 25 when high-intensity pulsed laser light is focused on target 25. X-rays present within this plasma are then used. In interferometer 22N, light emitted from LPX source 21 is divided into spectral components by a spectroscope (not shown), and light 27 of only a prescribed wavelength (e.g., 13 nm) is extracted. Light 27 is used as the light for wavefront-aberration-measuring interferometer 22N.

The intensity of LPX source 21 is smaller than that of the SOR undulator by an order of magnitude. Consequently, in interferometer 22N, first pinhole plate 86, which had only a single aperture in interferometers 22J, 22K, 22L, and 22M of the fifth and sixth embodiments shown in FIGS. 10a–15b and discussed above, is replaced with a first pinhole cluster plate 87. The latter includes a plurality of pinhole clusters 87c, each of which contains a plurality of pinholes 87o clustered together in a microlocation, as shown in FIG. 16b.

Referring again to FIG. 16a, in LPX source 21, a laser light source 23 supplies high-intensity pulsed laser light of a wavelength in the range from the infrared region to the visible region. Laser light source 23 may be, for example, a YAG laser excited by a semiconductor laser, an excimer laser, or the like. This laser light is condensed by a condenser optical system 29 onto target 25. Target 25 receives the high-intensity laser light, rises in temperature and is excited to the plasma state, and emits X-rays 27 during transitions to a lower potential state. By passing X-rays 27 through a spectroscope (not shown), quasimonochromatic light 27 only of wavelength 13 nm is extracted, which is then acted on by condenser mirror 64 and irradiates a pinhole cluster 87c on first pinhole cluster plate 87.

Referring again to FIG. 16b, first pinhole cluster plate 87 has pinhole clusters 87c, each of which comprises a plurality of pinholes 87o clustered in a microlocation at a position for which the wavefront aberration of optical system 37 is to be measured. Note that in FIG. 16b, pinhole cluster 87c is shown as having only four pinholes 87o. However, pinhole cluster 87c preferably actually comprises one hundred or more pinholes 87o. Pinholes 87o are of a size much smaller than the size of the Airy disk 0.6 $\lambda$/NA, where $\lambda$ is the wavelength of quasimonochromatic light 27 and NA is the numerical aperture on the incident side (first pinhole cluster plate 87 side) of optical system 37. In addition, FIG. 16b shows an exemplary schematic arrangement wherein a plurality of pinhole clusters 87c are formed on first pinhole cluster plate 87. In practice the positions at which pinhole clusters 87c are formed to correspond to the positions of object points of optical system 37 for which measurement is desired.

Returning to FIG. 16a, the entire region of one pinhole cluster 87c on first pinhole cluster plate 87 is illuminated by quasimonochromatic light 27. A plurality of ideal spherical wavefronts are generated from the numerous pinholes 87o of the illuminated pinhole cluster 87c. The plurality of ideal spherical wavefronts passes through optical system 37, and then proceeds to and converges at image plane IP of optical system 37, which position is made conjugate to first pinhole cluster plate 87 by optical system 37.

Although not shown in FIGS. 16a–16c, in interferometer 22N one of pinhole clusters 87c on first pinhole cluster plate 87 is selectively illuminated, just as in the case of interferometers 22J, 22K, and 22L of the fifth embodiment, discussed above.

In interferometer 22N diffraction grating 62 is arranged between optical system 37 and the location of the image plane IP of optical system 37. The light that exits optical system 37 and passes through diffraction grating 62 is diffracted by diffraction grating 62 and proceeds to a second dual hole cluster plate 89.

FIG. 16c shows a preferred constitution of second dual hole cluster plate 89. Second dual hole cluster plate 89 has pinhole cluster 89c comprising a plurality of pinholes 89o provided in one-to-one correspondence with the pinholes 87o of which plurality of pinhole clusters 87c on first pinhole cluster plate 87 are each comprised, and a plurality of apertures 89a provided in one-to-one correspondence with the plurality of pinhole clusters 87c. In other words, one aperture 89a corresponds to one pinhole cluster 87c comprising a plurality of pinholes 87o.

At this time, if second dual hole cluster plate 89 is arranged at image plane IP, then plurality of pinhole clusters 89c and plurality of apertures 89a will be positionally related so that pinhole cluster 89c is positioned in the optical path of the zeroeth-order peak P0 of the diffraction pattern produced by diffraction grating 62, and so that aperture 89a is positioned in the optical path of first-order peak P1 of the diffraction pattern produced by diffraction grating 62.

Accordingly, the ideal spherical wavefronts from pinhole cluster 87c on first pinhole cluster plate 87 pass through optical system 37 and are then diffracted by diffraction grating 62. Of the light produced by this diffraction, zeroeth-order peak P0 of the diffraction pattern arrives at the pinhole cluster 89c on second dual hole cluster plate 89, which corresponds to illuminated pinhole cluster 87c. In addition, first-order peak P1 of the diffraction pattern arrives at the aperture 89a on second dual hole cluster plate 89, which corresponds to illuminated pinhole cluster 87c. Zeroeth-order peak P0 of the diffraction pattern and first-order peak P1 of the diffraction pattern have wavefronts corresponding in shape to the wavefront aberration of optical system 37. Zeroeth-order peak P0 of the diffraction pattern is diffracted by pinhole cluster 89c as it passes therethrough and is converted to a second group of ideal spherical wavefronts. First-order peak P1 of the diffraction pattern passes through aperture 89a and exits therefrom without being diffracted. The light from the second ideal spherical wavefront group and the light from aperture 89a mutually interfere.

Accordingly, interference fringes due to interference between the ideal spherical wavefront group from pinhole cluster 89c and the wavefront from aperture 89a are formed on detector 60 arranged on the exit side of second dual hole cluster plate 89 (i.e., on the side of second dual hole cluster plate 89 opposite from optical system 37). Furthermore, the interference fringes on detector 60 form a shape corresponding to the deviation from an ideal spherical wavefront of the wavefront that passes through optical system 37. The wavefront aberration of optical system 37 can be determined by analyzing these interference fringes via computer CU electrically connected to detector 60, just as in the previously mentioned embodiments.

Furthermore, although not shown in FIG. 16a, detector 60 is constituted so as to be capable of movement parallel to image plane IP of optical system 37 so that it can be made to selectively receive the light from pinhole cluster 89c and aperture 89a corresponding to illuminated pinhole cluster 87c, just as in interferometers 22J, 22K, and 22L of the fifth embodiment, discussed above. As a result, wavefront aberration can be measured at a plurality of measurement points within object plane OP of optical system 37.

The seventh embodiment of the present invention as described above can provide a wavefront-aberration-measuring interferometer 22N that can be used even in an ordinary factory.

Furthermore, while diffraction grating 62 in interferometer 22N of the seventh embodiment shown in FIG. 16a is arranged in the optical path between optical system 37 and second dual hole cluster plate 89, diffraction grating 62 may also be arranged in the optical path between first pinhole cluster plate 87 and second dual hole cluster plate 89. It being possible, for example, to arrange diffraction grating 62 in the optical path between first pinhole cluster plate 87 and optical system 37. Also, while interferometer 22N employs two peaks of the diffraction pattern produced by diffraction grating 62 (zeroeth-order peak P0 and first-order peak P1) the present invention is not limited to employment of two such peaks or of employment of combinations of the zeroeth-order and first-order peaks.

Eighth Embodiment

Figure 17A:
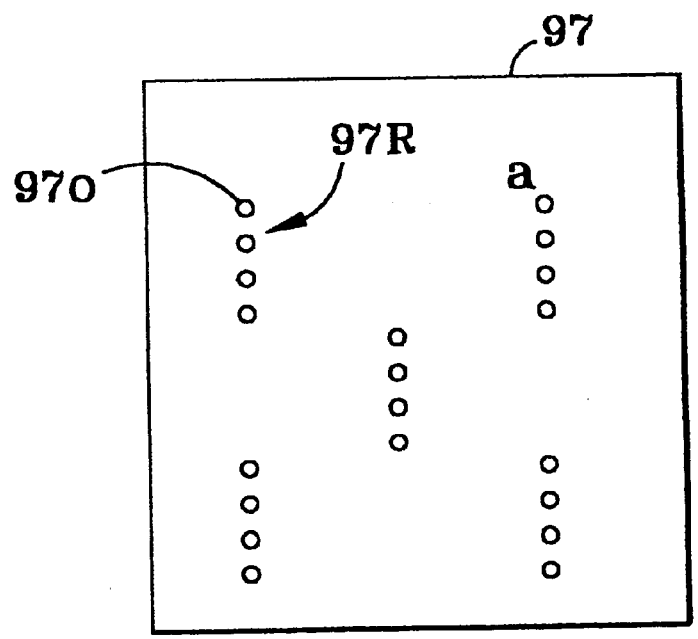
FIG. 17a is a plan view of the first pinhole row plate of an eighth embodiment according to a third aspect of the present invention.
Figure 17B:
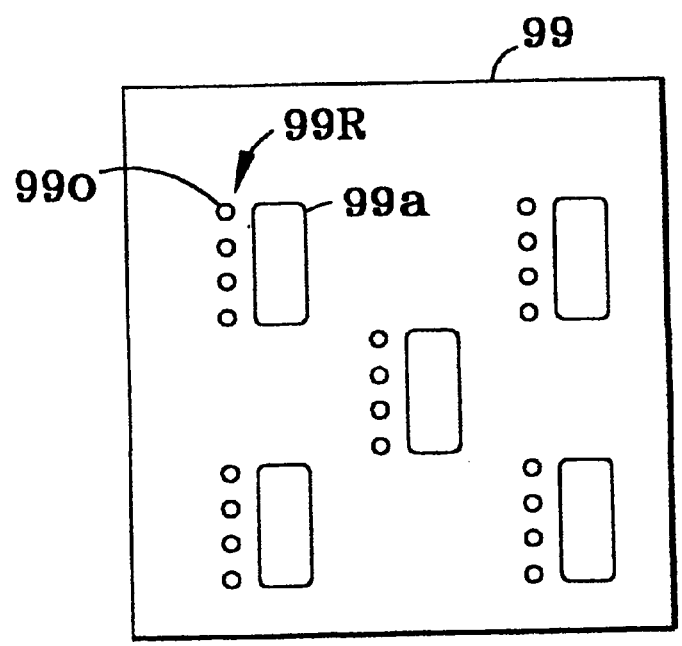
FIG. 17b is a plan view of the second dual hole row plate in an eighth embodiment according to a third aspect of the present invention.

Referring now to FIGS. 17a and 17b, an eighth embodiment according to a third aspect of the present invention is described. Interferometer 22N of the seventh embodiment shown in FIG. 16a and described above employed pinhole clusters 87c, 89c provided with a plurality of pinholes 87o, 89o in prescribed microlocations. However, a pinhole row plate 97 may be used, wherein plate 97 includes a plurality of a pinhole rows 97R wherein a plurality of pinholes 97o are arranged unidimensionally in a prescribed direction, as shown in FIG. 17a. In this case, first pinhole row plate 97 is provided with a plurality of rows 97R of pinholes 97o arrayed in matrix-like fashion so as to correspond to a plurality of measurement points in object plane OP or image plane IP of optical system 37. Although FIG. 17a shows a pinhole row 97R having only four pinholes 97o. an actual pinhole row 97R comprises 100 or more pinholes 97o. Pinholes 97o are of a size smaller than the Airy disk 0.6 λ/NA, where λ is the wavelength of quasimonochromatic light 84 and NA is the numerical aperture on the incident side of optical system 37 (i.e., on the side thereof at which first pinhole row plate 97, which here takes the place of first pinhole cluster plate 87 shown in FIG. 16a, is present).

Referring back and forth between FIGS. 16a–16c and FIGS. 17a–17b, if first pinhole row plate 97 is used in place of first pinhole cluster plate 87, then a second dual hole row plate 99 should be used in place of second dual hole cluster plate 89. Second dual hole row plate 99 has a plurality of pinhole rows 99R, each of which comprises a plurality of pinholes 99o provided in one-to-one correspondence with pinholes 97o of which pinhole rows 97R on first pinhole row plate 97 are each comprised. In addition, plate 99 has a plurality of apertures 99a provided in one-to-one correspondence with plurality of pinhole rows 97o. Furthermore, each of the plurality of pinhole rows 99R comprises numerous pinholes 99o arrayed unidimensionally in a prescribed direction. In addition, one aperture 99a corresponds to one pinhole row 97R comprising plurality of pinholes 97o.

Employment of a pinhole row 97R, 99R thus comprising a plurality of pinholes 97o, 99o arrayed unidimensionally in a prescribed direction makes it possible to reduce noise caused by the intermixing of light among the plurality of pinholes 92o, 94o, 93o, 95o, 96o, 87o, 89o, and measurement accuracy can thereby be further improved.

It is also preferable to make the pitch of the plurality of pinholes arrayed unidimensionally in a prescribed direction be 10 to 25 times the radius of the Airy disk 0.6 λ/NA as determined by the numerical aperture on the first pinhole row plate 97 side of optical system 37. It is further preferable to make it approximately 16 to 20 times this Airy disk radius.

Ninth Embodiment

Figure 18A:
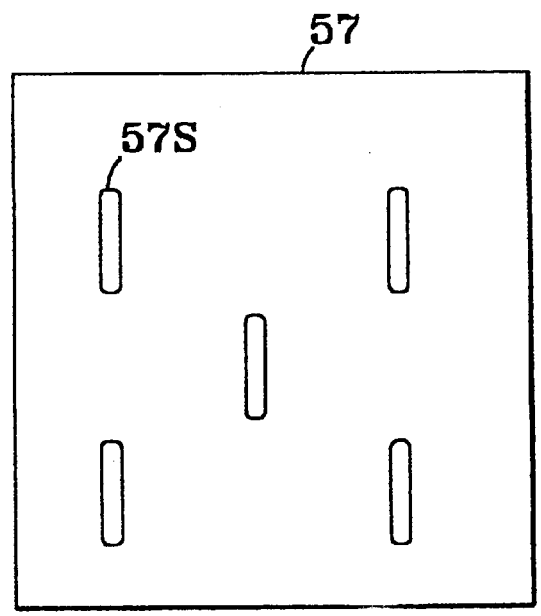
FIG. 18a is a plan view of the first slit plate of a ninth embodiment according to a third aspect of the present invention.
Figure 18B:
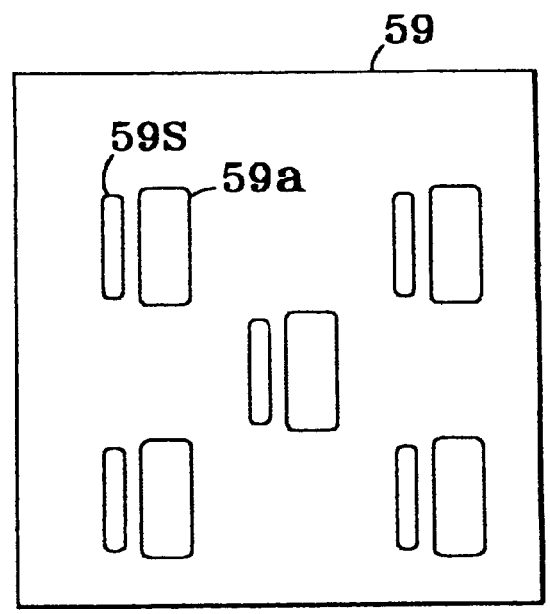
FIG. 18b is a plan view of the second dual slit plate of a ninth embodiment according to a third aspect of the present invention.

Referring now to FIGS. 18a and 18b, we describe a ninth embodiment according to a third aspect of the present invention. It is possible to use slit-shaped apertures 57s, 59s in place of pinhole clusters 87c, 89c in interferometer 22N shown in FIG. 16a and described above. FIGS. 18a and 18b show slit plates 57, 59 provided with pluralities of slit-shaped apertures 57s, 59s.

In describing the use of first slit plate 57 and second dual slit plate 59 in place of first pinhole cluster plate 87 and second dual hole cluster plate 89, to reference is made back and forth between FIGS. 16a–16c and FIGS. 18a–18b.

In FIG. 18a, first slit plate 57 is provided with a plurality of slit-shaped apertures 57s arrayed in matrix-like fashion so as to correspond to a plurality of measurement points in object plane OP image plane IP of optical system 37. Furthermore, the slit shape mentioned in the present embodiment refers to a shape extending unidimensionally in a prescribed direction, the overall shape hereof not being limited to rectangular. In addition, the width in the latitudinal direction of slit-shaped aperture 57s is of a size well smaller than the size of the Airy disk 0.6 λ/NA, where λ is the wavelength of quasimonochromatic light 27 and NA is the by numerical aperture on the incident side (on the side of first slit plate 57, which here corresponds to first pinhole cluster plate 87 in FIG. 16a) of optical system 37. Upon illumination of a slit-shaped aperture 57s, the wavefront emitted therefrom will be such that its cross section in the short direction of the slit-shaped aperture 57s is the same as that of an ideal spherical wavefront (i.e., this then can be said to represent a one-dimensional ideal spherical wavefront).

If first slit plate 57 shown in FIG. 18a is used in place of first pinhole cluster plate 87 shown in FIG. 16b, then second dual slit plate 59 shown in FIG. 18b should be used in place of second dual hole cluster plate 89. Second dual slit plate 59 comprises a plurality of slit-shaped apertures 59s provided in one-to-one correspondence with the plurality of slit-shaped apertures 57s on first slit plate 57, and a plurality of apertures 59a provided in one-to-one correspondence with the plurality of slit-shaped apertures 57s on first slit plate 57.

In the ninth embodiment of the invention, slit plates 57, 59 shown in FIGS. 18a and 18b are incorporated in wavefront-aberration-measuring interferometer 22N of the seventh embodiment shown in FIG. 16a. Operation in this case is as follows.

First, one of the plurality of slit-shaped apertures 57s first slit plate 57 corresponding to a desired measurement point is illuminated with light 27 from LPX source 21. The wave emitted from the illuminated slit-shaped aperture 57s is such that a one-dimensional ideal spherical wavefront is generated in the short direction of slit-shaped aperture 57s. This one-dimensional ideal spherical wavefront passes through optical system 37 and is diffracted by diffraction grating 62. Zeroeth-order peak P0 of the diffraction pattern arrives at the corresponding slit-shaped aperture 59s on second dual slit plate 59, and first-order peak P1 of the diffraction pattern arrives at aperture 59a on second dual slit plate 59.

Furthermore, a one-dimensional ideal spherical wavefront is generated in the short direction of the corresponding slit-shaped aperture 59s on second dual slit plate 59, and a wavefront corresponding in shape to the wavefront aberration of optical system 37 passes through aperture 59a. The wavefront of the one-dimensional ideal spherical wavefront and the wavefront from the aperture 59a mutually interfere and form interference fringes on detector 60. The wavefront aberration of optical system 37 can be measured by analyzing these interference fringes in computer CU. Furthermore, it is possible in this ninth embodiment that measurement accuracy will lower in a direction parallel to the long direction of slits 57s, 59s. If this should be the case, all that need be done to rectify this is to arrange slit plates 57, 59 and optical system 37 such that they are rotatable relative to one another, or to provide a plurality of slit-shaped apertures 57s, 59s having long directions in mutually different orientations in place of the slit-shaped apertures 57s, 59s shown in FIGS. 18a and 18b.

Thus, by using slit-shaped apertures 57s, 59s, it is possible to further increase light flux as compared with cases wherein pinhole plates having a single pinhole, or a pinhole cluster or a pinhole row comprising a plurality of pinholes, are used. This constitution corresponds to a shearing interferometer.

Also, while second dual slit plate 59 makes use of two peaks of the diffraction pattern produced by diffraction grating 62 (zeroeth-order peak P0 and first-order peak P1), the present invention is not limited to employment of two such peaks or of employment of combinations of the zeroeth-order and first-order peaks thereof.

Tenth Embodiment

Figure 19:
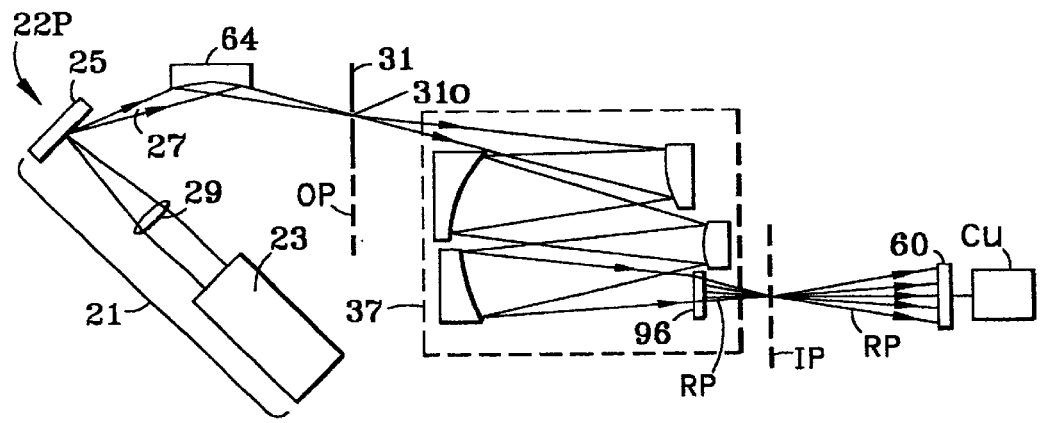
FIG. 19 is a schematic optical diagram of a sixth wavefront-aberration-measuring interferometer of a tenth embodiment according to a third aspect of the present invention.

Referring to FIG. 19, we describe a sixth wavefront-aberration-measuring interferometer 22P of a tenth embodiment according to a third aspect of the present invention.

Interferometer 22P is a variation on the above-discussed interferometers 22M, 22N in the sixth embodiment shown in FIGS. 15a–16c. An LPX source 21 is used in interferometer 22P of the tenth embodiment in place of the SOR undulator light source (not shown) that was used in interferometers 22M, 22N of the sixth embodiment.

Referring to FIG. 19, in LPX source 21, laser light source 23 supplies pulsed laser light of a wavelength in the range from the infrared region to the visible light region. Laser light source 23 may be, for example, a YAG laser excited by a semiconductor laser, an excimer laser, or the like. This laser light is condensed by condenser optical system 29 onto target 25. Target 25 receives the high-intensity laser light, rises in temperature and is excited to the plasma state, and emits X-rays 27 during transitions to a lower potential state. By passing X-rays 27 through a spectroscope (not shown), quasimonochromatic light 27 only of wavelength 13 nm is extracted, which is then acted on by condenser mirror 64 and irradiates a pinhole plate 31.

Pinhole plate 31 has a single aperture much larger (i.e., ten or more times) than the diameter of the Airy disk 0.6 λ/NA, where λ is the wavelength of quasimonochromatic light 27 and NA is the numerical aperture on the incident side (pinhole plate 31 side) of optical system 37. Here, so long as aperture 31o of pinhole plate 31 can be illuminated such that there is uniform illuminance within object plane OP of optical system 37 and such that there is uniform illuminance within the cross section of the light beam incident pinhole plate 31, there is no need to make the size of the aperture of pinhole plate 31 smaller than the Airy disk, as is the case for the above-described embodiments.

In interferometer 22P, illumination is such that there is uniform illuminance within object plane OP and within the cross section of the light beam incident pinhole plate 31. Accordingly, the pinhole plate 31 which is used can have a large aperture 31o such as has been described.

As in the case in the above-described embodiments, in interferometer 22P, light exiting from aperture 31o of pinhole plate 31 can be regarded as having an ideal spherical wavefront.

As in the case in interferometer 22M, in interferometer 22P, second Hartmann plate 96 (see FIG. 15b) having a plurality of apertures 96o is arranged between image plane IP of optical system 37 (i.e., a location made conjugate to pinhole plate 31 by optical system 37) and optical system 37.

With continuing reference to FIG. 19, the light beam from aperture 31o of pinhole plate 31, upon exiting from optical system 37, forms, due to the action of the plurality of apertures 96o of second Hartmann plate 96, a plurality of ray groups RG that are the same in number as the number of apertures 96o. Ray groups RG then proceed to image plane IP of optical system 37. Ray groups RG converge at image plane IP and arrive at detector 60 in a divergent state. If the plane of the pupil (not shown) of optical system 37 is subdivided into a plurality of sections, ray groups RG that pass through the plurality of apertures 96o on second Hartmann plate 96 respectively correspond to rays passing through each such section. As a result, the lateral aberration of optical system 37 can be determined if the position at which each of the ray groups RG arrives at detector 60 is detected. The wavefront aberration of optical system 37 can then be determined from this lateral aberration using computer CU, as describe above.

Eleventh Embodiment

Figure 20A:
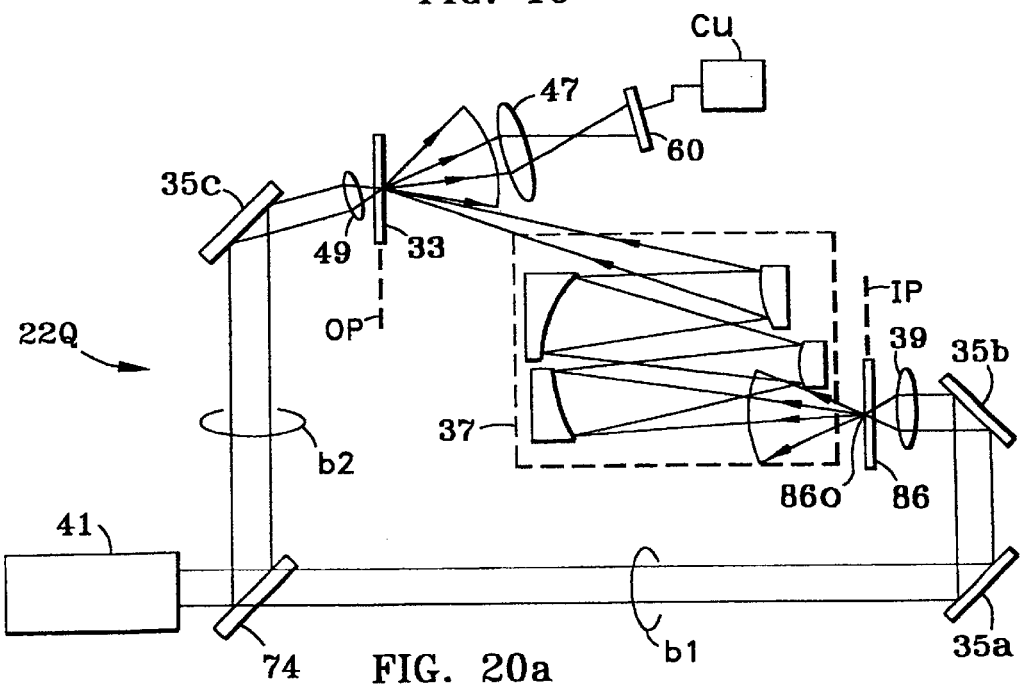
FIG. 20a is a schematic optical diagram of seventh wavefront-aberration-measuring interferometer of an eleventh embodiment according to a third aspect of the present invention.
Figure 20B:
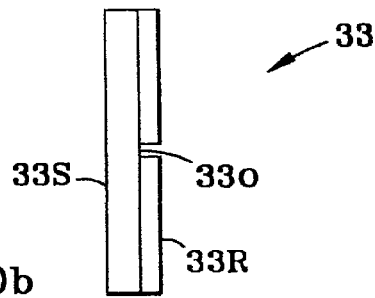
Figure 21A:
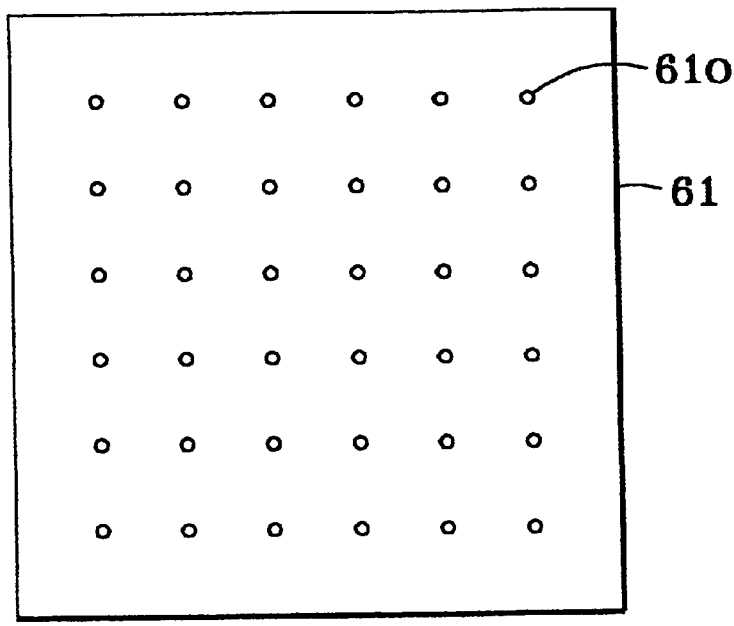
Figure 21B:
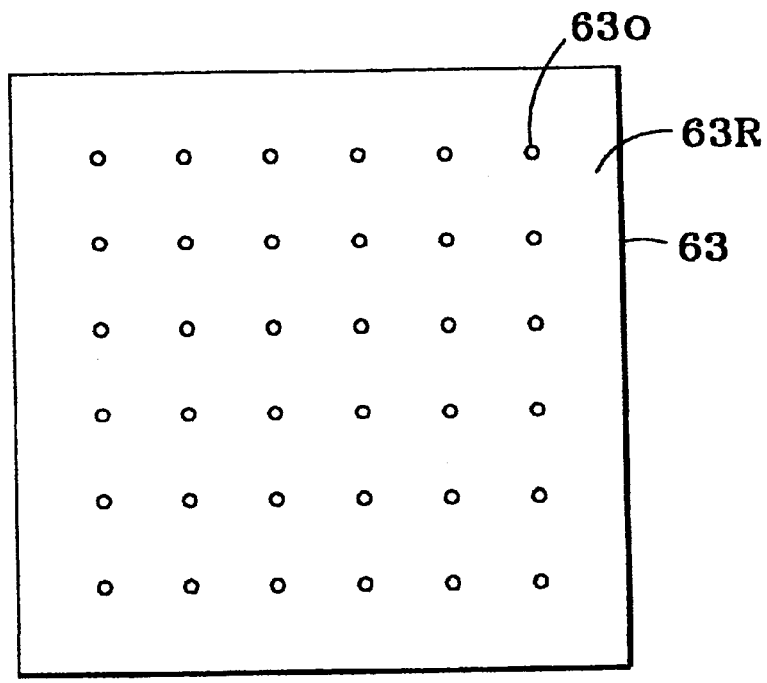

Referring now to FIGS. 20a and 20b, a seventh wavefront-aberration-measuring interferometer 22Q in an eleventh embodiment according to a third aspect of the present invention is described.

Although a light source 21 supplying light in the soft X-ray wavelength region was used as light source in the above-described interferometers 22N–22P in the seventh through tenth embodiments, it may be convenient to use an ordinary laser light source 41 (see FIG. 20a), not an X-ray source 21 (see FIGS. 16a and 19). when assembling and adjusting optical system 37 at an ordinary factory.

FIG. 20a shows wavefront-aberration-measuring interferometer 22Q of the tenth embodiment which uses a non-X-ray laser light source 41. FIGS. 20a–23 are intended to assist in explaining the principle of the eleventh embodiment.

Referring to FIG. 20a, in interferometer 22Q, laser light source 41 supplies laser light of a prescribed wavelength. This laser light is split by a beam splitter 74 adjacent light source 41. One of the beams b1 so split travels by way of two folding mirrors 35a and 35b to a condenser lens 39, and is guided to first pinhole plate 86 having a single pinhole 86o. First pinhole plate 86 is arranged at the location of image plane IP of optical system 37. Pinhole 86o is of a size smaller than the diameter of the Airy disk 0.6 λ/NA, where λ is the wavelength of the laser light and NA is the numerical aperture NA on the incident side (first pinhole plate 86 side) of optical system 37. Accordingly, a first ideal spherical wavefront is generated from pinhole 86o of first pinhole plate 86.

The first ideal spherical wavefront from first pinhole plate 86 passes through optical system 37 and is guided to second pinhole mirror plate 33 arranged at a position conjugate to first pinhole plate 86 by optical system 37.

Referring to FIG. 20b second pinhole mirror plate 33 comprises an optically transparent substrate 33S, reflective surface 33R provided on substrate 33S, and aperture 33o, which is a region wherein reflective surface 33R is not provided. Furthermore, aperture 33o of second pinhole mirror plate 33 is of a size smaller than the diameter of the Airy disk 0.6 λ/NA, where λ is the wavelength of the laser light and NA is the numerical aperture on the exit side (second pinhole mirror plate 33 side) of optical system 37.

Returning again to FIG. 20a, light beam b2 produced by splitting at beam splitter 74 travels by way of a folding mirror 35c to pass through a condenser lens 49, and is then guided in a condensed state to the rear side of second pinhole mirror plate 33R (i.e., the back thereof, if the side on which reflective surface 33R is applied is taken as the front thereof), which is arranged in object plane OP of optical system 37.

Accordingly, a second ideal spherical wavefront will be generated at second pinhole mirror plate 33 when light beam b2 from the rear side of second pinhole mirror plate 33 passes through aperture 33o. In addition, the light beam that passes through optical system 37 is reflected by reflective surface 33R of second pinhole mirror plate 33. This reflected light has a wavefront corresponding in shape to the wavefront aberration of optical system 37.

The second ideal spherical wavefront from aperture 33o of second pinhole mirror plate 33 and the reflected light from reflective surface 33R of second pinhole mirror plate 33 arrive at detector 60 by way of lens 47, and form interference fringes on detector 60.

The interference fringes on detector 60 form a shape corresponding to the deviation from an ideal spherical wavefront of the wavefront that passes through optical system 37. The wavefront aberration of optical system 37 can be determined by analyzing these interference fringes using computer CU, as described above.

In FIGS. 20a and 20b, which illustrate the principle of the wavefront-aberration-measuring interferometer 22Q of the eleventh embodiment, one prescribed point in object plane OP (or image plane IP) of optical system 37 is used as the measurement point. If a plurality of measurement points are to be measured, then, referring briefly to FIG. 21a. first pinhole array plate 61 wherein a plurality of pinholes 61o are arranged in a prescribed array may be used in place of first pinhole plate 86 of FIG. 20a. In addition, a second pinhole mirror array plate 63 having a plurality of pinholes 63o and a reflective interstitial surface 63R may be used in place of second pinhole mirror plate 33 shown in FIGS. 16a and 16b.

Figure 22:
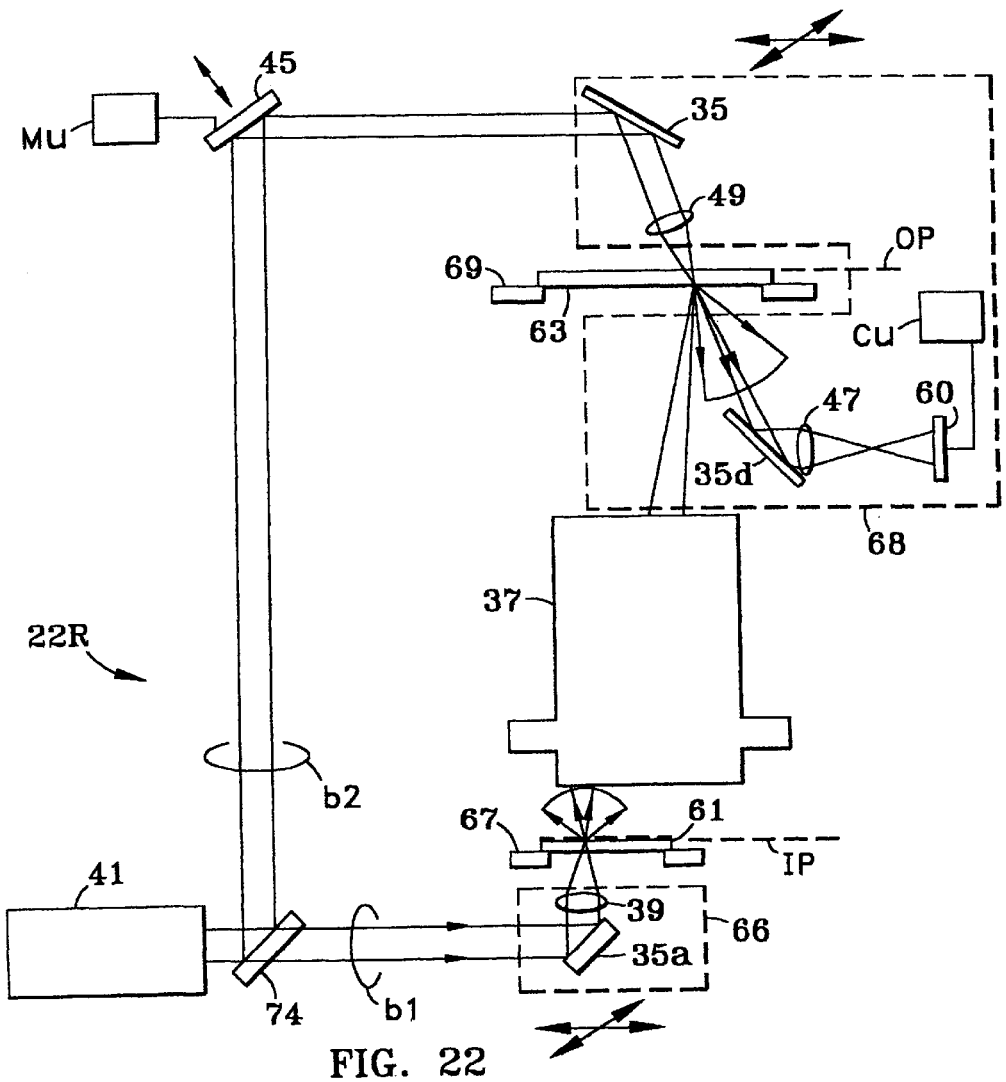

Referring now to FIG. 22, an eighth wavefront-aberration-measuring interferometer 22R, which is a variation on wavefront-aberration-measuring interferometer 22Q of the eleventh embodiment wherein the wavefront aberration of optical system 37 can be measured at a plurality of measurement points, is described. In FIG. 22, elements similar in function to elements appearing in FIG. 20a have been given the same reference numerals as in FIG. 20a and description thereof will be omitted here for the sake of convenience.

Referring to FIG. 22 and interferometer 22R, laser light of a prescribed wavelength from laser light source 41 is split by beam splitter 74. One of the light beams b1 so split sequentially travels by way of folding mirror 35a to condenser lens 39 provided on condenser lens stage 66 capable of movement parallel to the image plane of optical system 37, thereafter arriving at first pinhole array plate 61.

Referring back to FIG. 21a, first pinhole array plate 61 has a plurality of pinholes 61o arrayed in a matrix. The positions of the plurality of pinholes 61o correspond to the positions of measurement points for optical system 37. Furthermore, each of the plurality of pinholes 61o is of a size smaller than the diameter of the Airy disk 0.6 λ/NA, where λ is the wavelength of the laser light and the NA is the numerical aperture on the incident side (first pinhole array plate 61 side) of optical system 37. Accordingly, upon being illuminated, pinhole 61o on first pinhole array plate 61 will generate an ideal spherical wavefront.

Returning again to FIG. 22, as a result of moving condenser lens stage 66, a desired pinhole 61o on first pinhole array plate 61 is selectively illuminated. Furthermore, the position at which the laser light is incident folding mirror 35a mounted on condenser lens stage 66 changes as condenser lens stage 66 is moved. In addition, instead of one of pinholes 61o, a plurality of pinholes 61o may also be collectively illuminated.

With continuing reference to FIG. 22, the ideal spherical wavefront from first pinhole array plate 61 passes through optical system 37, and is then guided to second pinhole mirror array plate 63, located at a position conjugate to first pinhole array plate 61 by optical system 37.

Referring briefly again to FIG. 21b, second pinhole mirror array plate 63 is provided with reflective interstitial surface 63R arranged such that plurality of pinholes 63o form a matrix, no such reflective interstitial surface 63R being provided at the locations of pinholes 63o. Furthermore, each of the plurality of pinholes 63o of second pinhole mirror array plate 63 is of a size smaller than the diameter of the Airy disk 0.6 λ/NA, where λ is the wavelength of the laser light and NA is the numerical aperture on the exit side (second pinhole mirror array plate 63 side) of optical system 37.

Returning now to FIG. 22, light beam b2 produced by splitting at beam splitter 74 sequentially travels by way of oscillatory folding mirror 45 electrically connected to mirror oscillating unit MU, and then by way of folding mirror 35 to a condenser lens 49, and is then guided in a condensed state to the rear side of second pinhole mirror array plate 63 (i.e., the side opposite from the side at which reflective interstitial surface 63R is present), which is arranged in object plane OP of optical system 37.

Accordingly, an ideal spherical wavefront is generated at second pinhole mirror array plate 63 when light beam b2 from the rear side of second pinhole mirror array plate 63 passes through pinhole 63o. In addition, when the light beam that passes through optical system 37 is reflected by reflective interstitial surface 63R of second pinhole mirror array plate 63, the reflected light will have a wavefront corresponding in shape to the wavefront aberration of optical system 37.

The ideal spherical wavefront from pinhole 63o of second pinhole mirror array plate 63 and the light reflected by reflective interstitial surface 63R of second pinhole mirror array plate 63 arrive at detector 60 by way of another folding mirror 35d and lens 47, and form interference fringes on detector 60.

The interference fringes on detector 60 form a shape corresponding to the deviation from an ideal spherical wavefront of the wavefront that passes through optical system 37. The wavefront aberration of optical system 37 can be determined by analyzing these interference fringes using computer CU, as discussed above.

In interferometer 22R as a variation on the eleventh embodiment shown in FIG. 22, detector 60, along with the optical system which guides the light from second pinhole mirror array plate 63 to detector 60, and condenser lens 49 are mounted on Detector stage 68, which is capable of movement parallel to object plane OP of optical system 37. Detector stage 68 is constituted so that it is linked and moves with condenser lens stage 66 discussed above, and only pinhole 63o, corresponding to the illuminated pinhole 61o, can be seen from detector 60.

Accordingly, interference fringes are formed on detector 60 due to interference between the light that passes through optical system 37 from illuminated pinhole 61o and the diffracted light from pinhole 63o on second pinhole mirror array plate 63 corresponding to the illuminated pinhole 61o. Accordingly, the wavefront aberration at the measurement point where the illuminated pinhole 61o is positioned can be determined by analyzing these interference fringes.

Stable measurement can also be performed with interferometer 22R in this variation on the eleventh embodiment shown in FIG. 22, without being affected by vibrations caused by the movement of stages 66, 68 during measurement.

With continuing reference to FIG. 22, first pinhole array plate 61 is mounted on a vertical stage 67, which is capable of causing first pinhole array plate 61 to move in jogged (i.e., incremental) fashion in a direction parallel to the optical axis of optical system 37. Vertical stage 67 is secured to the same frame that supports optical system 37. In addition, second pinhole mirror array plate 63 is mounted on an XY stage 69, which is capable of causing second pinhole mirror array plate 63 to move in jogged fashion within object plane OP of optical system 37. XY stage 69 is attached to the abovementioned frame by way of a piezoelectric element. Furthermore, adjustment of focus can be performed by using vertical stage 67 to move first pinhole array plate 61. If there is distortion in optical system 37, XY stage 69 can be used to align the position of pinhole 63o.

Furthermore, a length measuring interferometer or other such microdisplacement sensor is preferably provided on XY stage 69, permitting distortion in optical system 37 to be measured based on the output from the microdisplacement sensor. Furthermore, in the present embodiment, the positions of the plurality of pinholes 61o of first pinhole array plate 61 and the plurality of pinholes 63o of second pinhole mirror array plate 63 are accurately measured beforehand using a coordinate measuring interferometer.

In addition, oscillatory folding mirror 45 in interferometer 22R in this variation on the eleventh embodiment shown in FIG. 22 is constituted so as to permit oscillation via mirror oscillation unit MU, the difference in lengths of the optical paths of the two beams produced by beam splitter 74 changing in accordance with this oscillation. As a result, a fringe scan can be executed for high-precision measurement.

COMPARATIVE EXAMPLE

Figure 23:
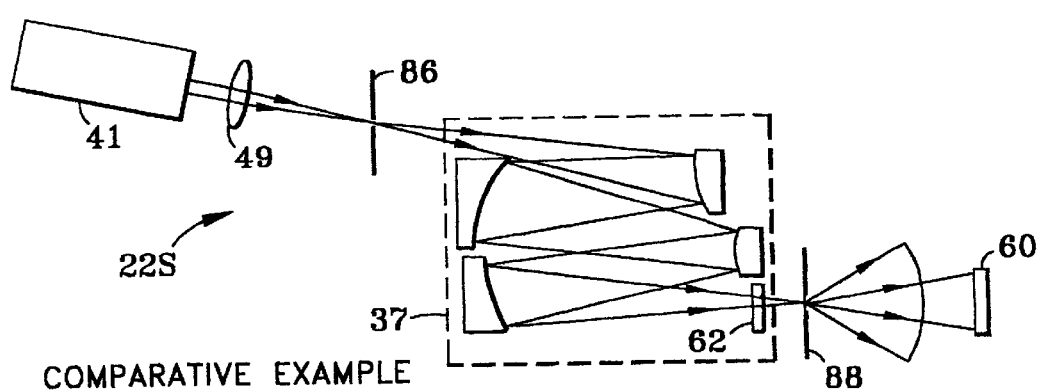
FIG. 23 is a schematic optical diagram of a wavefront-aberration-measuring apparatus serving as a comparative example for illustrating the advantage of interferometers of FIGS. 20a and 22.

Referring to FIG. 23, wavefront-aberration-measuring interferometer 22S is a comparative example for illustrating the advantage of interferometers 22Q and 22R of the eleventh embodiment. Interferometer 22S of the comparative example shown in FIG. 23 employs an ultraviolet laser 41 instead of the SOR undulator light source employed in interferometer 22J shown in FIG. 10a. As previously mentioned, measurement accuracy increases as the wavelength of the light source of the wavefront-aberration-measuring interferometer is shortened. Since the wavelength of an ultraviolet laser 41 is approximately 20 times longer than the working wavelength of optical system 37, the accuracy of interferometer 22S of the comparative example can be expected to be 20 times worse than that of interferometer 22J shown in FIG. 10a.

However, in interferometers 22Q and 22R of FIGS. 20a and A22, the reference wavefront is made to travel along an optical path separate from the measurement wavefront. Thus, measurement can be performed with a precision higher than is possible with interferometer 22S of the comparative example shown in FIG. 23. Thus, in interferometers 22Q and 22R of the eleventh embodiment, wavefront aberration can be measured with high precision without the need to use an X-ray source.

Method of Calibrating Aspheric-Shape-Measuring Interferometer

Figure 24:
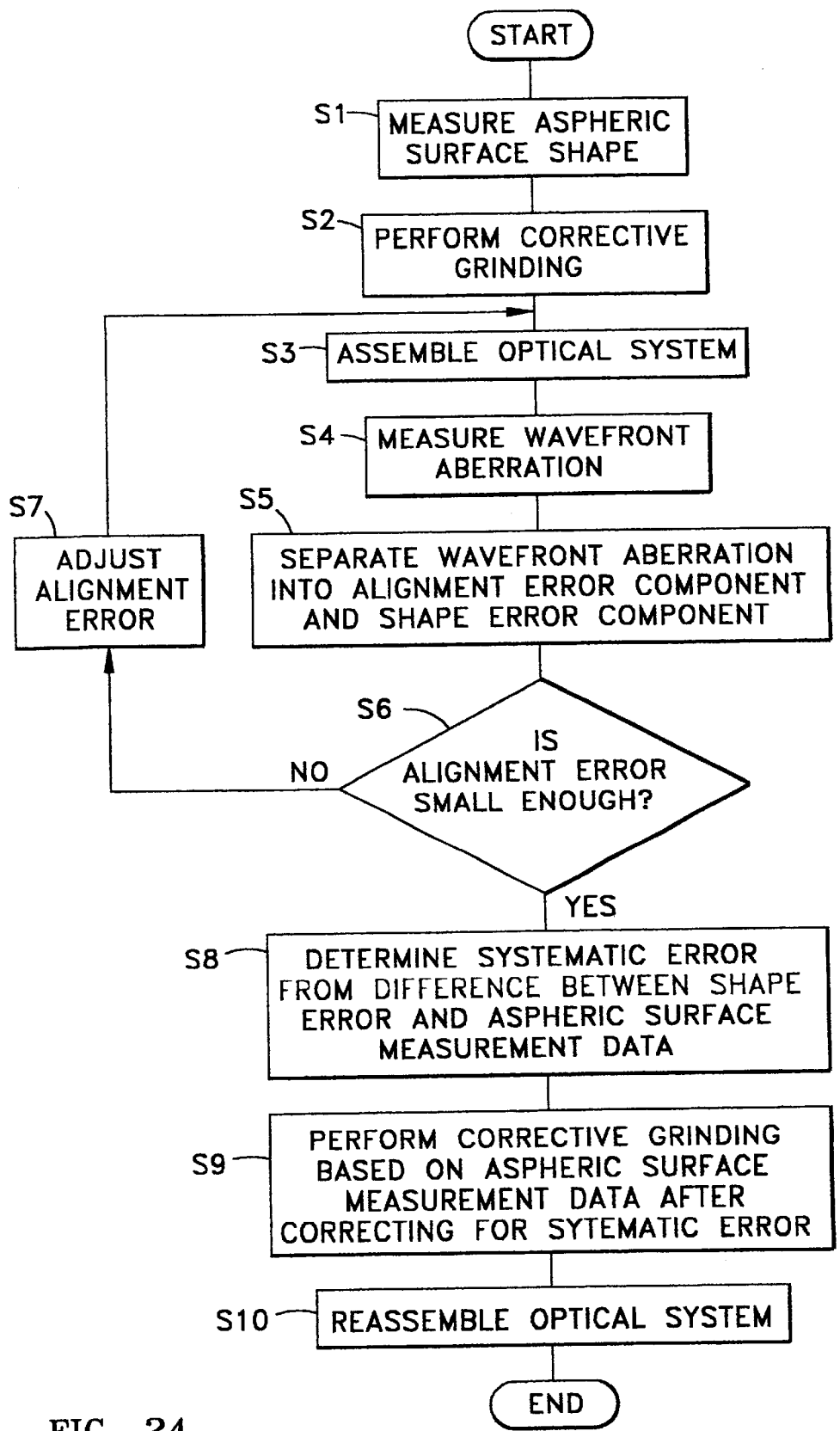

FIG. 24 is a flowchart for assisting in describing a method for calibrating an aspheric-surface-shape measuring interferometer of the type shown in FIGS. 1–7. In the course of this calibration, a wavefront-aberration-measuring interferometer of the type shown in FIGS. 10a–22 is used to verify the aspheric shape obtained using the aspheric-surface-shape measuring interferometer. This method or variations thereof can be applied to any of these interferometers for the sake of convenience, however, we take the example of calibration of aspheric-surface-shape measuring interferometer 22H of the fourth embodiment shown in FIG. 7 using wavefront-aberration-measuring interferometer 22J of the fifth embodiment shown in FIG. 10a.

Before executing step S1 in FIG. 24, the aspheric surface under test 38 is first machined to a surface accuracy of approximately 10 nm RMS using well-known technology.

At step S1 in FIG. 24, the surface shape of the abovementioned aspheric test surface 38 is measured using interferometer 22H of the fourth embodiment of the present invention shown in FIG. 7. Furthermore, interferometer 22H of the fourth embodiment may also be used starting from the time when the aspheric surface is first machined. When performing measurements using interferometer 22H, it is preferable to minimize asymmetric systematic errors (errors in reference surface 70) by collecting data at stepped angular rotations obtained by either rotating test surface 38 about the optical axis with respect to reference surface 70 in stepwise fashion or rotating reference surface 70 about the optical axis with respect to test surface 38 in stepwise fashion, and averaging the data obtained.

Figure 25:
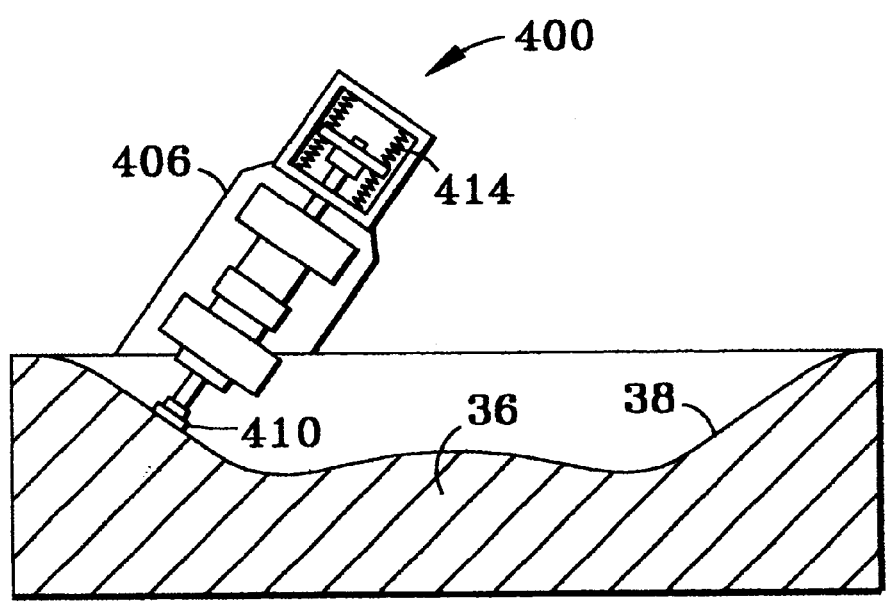
FIG. 25 is a cross-sectional showing a small tool grinding apparatus used in the interferometer calibration method indicated in the flowchart of FIG. 24.

At step S2, using the measurement data from step S1, corrective grinding is performed on the aspheric surface 38 so as to make the shape of aspheric test surface 38 conform to the design data. FIG. 25 shows a small tool grinding apparatus 400 for performing this corrective grinding. Referring to FIG. 25, small tool grinding apparatus 400 has grinding head 406 provided with a polisher 410 that rotates, and coil spring 414 that applies a prescribed pressure to polisher 414. Aspheric test surface 38 is ground as a result of application of a constant load in a direction normal to aspheric test surface 38 as optical test element 36 is rotated. The amount of grinding is proportional to the dwell time of polisher 410 (i.e., the time that polisher 410 remains at a given position and grinds). Furthermore, the shape of test surface 38 is measured using interferometer 22H shown in FIG. 7, just as was performed at step S1. If the result of measurement is that the measured aspheric shape differs from the design shape, the shape of test surface 38 is again corrected using small tool grinding apparatus 82. By repeating this measurement and correction process, the measured aspheric shape and the design aspheric shape can be made to coincide.

At step S3, optical element 36 having test surface 38 shaped as a result of the operations at step S2 is assembled in the optical system 37 of which it is an optical component.

At step S4, the wavefront aberration of the optical system 37 assembled in step S3 is measured. In connection with the measurement of this wavefront aberration, a PDI (point diffraction interferometer) employing an SOR (synchrotron orbital radiation) undulator light source, such as in interferometer 22J shown in FIG. 10a, is used. Since the measurement wavelength of interferometer 22J is short, at about 13 nm, the wavefront aberration of the optical system can be measured with high precision, specifically to 0.13 nm RMS or better. The constitutions of exemplary interferometers which may be applied here are described under the fifth through eleventh embodiments of the present invention shown in FIGS. 10a–22.

At step S5, the causes of error in the wavefront aberration measured at step S4 is broken down into an alignment error component (for each aspheric surface) and a shape error component for each surface.

Specifically, a computer uses, for example, known optical system automatic correction software, assigns the position of test surface 38 (spacing, inclination and shift) and the shape of test surface 38 as variables, initializes the measurement values of the wavefront aberration, and performs optimization so that the wavefront aberration approaches zero. The difference between the position and shape of test surface 38 when optimized and the position and shape of test surface 38 prior to optimization corresponds to the alignment error (positional error) and shape error, respectively.

At step S6, the alignment error calculated at step S5 is evaluated to determine whether it is sufficiently small. If it is not small enough, the flow operation proceeds to step S7 where the alignment error is adjusted. If it is small enough, the flow proceeds to step S8.

At step S7, alignment of optical element 36 in optical system 37 is adjusted based on the alignment error calculated at step S5, following which flow returns to step S4.

Note that the sequence of operations between steps S4 and S7 are repeated until the alignment error calculated at step S5 is sufficiently small.

At step S8, the difference between the shape error (shape error isolated by the most recent iteration of step S5) in the final wavefront aberration (wavefront aberration as determined by the most recent iteration of step S4) and the final measured aspheric surface shape data calculated in step S2 is calculated. This difference corresponds to the systematic error of aspheric-surface-shape-measuring interferometer 22H. This error corresponds to the shape error of reference surface (Fizeau surface) 70 in the aspheric-surface-shape-measuring (Fizeau-type) interferometer 22H.

At step S9, the final aspheric surface shape data measured at step S2 is corrected by the amount of the systematic error calculated at step S8, and test surface 38 is reworked using small tool grinding apparatus 400 based on this corrected aspheric surface shape data. At this time, optical element 36 having test surface 38 is removed from optical system 37 of which it is a part before corrective grinding operations can be carried out.

After steps S1 through S9 have been executed, optical system 37 is reassembled and the wavefront aberration is measured using interferometer 22J shown in FIG. 10a. The measured values are again separated into an alignment error component and a shape error component for each surface, and the surface error is verified to determine whether it is smaller than previously measured.

By numerous repetitions of the series of procedures including machining of aspheric test surface 38, assembly in optical system 37, measuring of wavefront aberration, and determining the systematic error in aspheric-surface-shape-measuring interferometer 22H as described above, systematic errors in aspheric-surface-shape-measuring interferometer 22H can be identified. Furthermore, if such errors are large (e.g., 2 nm RMS or greater), aspheric-surface-shape-measuring interferometer 22H must itself be corrected (i.e., the surface shape of aspheric reference surface 70 must be corrected).

If the measurement values during subsequent measurements and machining are continuously corrected by the amount of the systematic error in aspheric-surface-shape-measuring interferometer 22H as calculated by this procedure and this then used as data during operations using the corrective grinding apparatus 400, an aspheric surface 38 can be machined with good accuracy.

Since measurement accuracy, and in particular reproducibility, with aspheric-surface-shape-measuring interferometer 22H of the fourth embodiment are excellent, the above-described calibration method is extremely effective.

Furthermore, should existence of systematic errors be confirmed thereafter as a result of wavefront aberration measurement based at the exposure wavelength or other such measurements performed during a production run, systematic error may be corrected at each such occasion so as to constantly approach design values.

In addition, after machining the aspheric surface 38 using the machining and measurement procedures based on the present invention, optical system 37 is assembled and a reflective film (not shown) must be applied to each surface 38 to be made reflective prior to measurement of the wavefront aberration. The shape of surface 38 may change under the influence of stress from the film when applying and removing (e.g., to perform corrective grinding) the reflective film. Although the reproducibility of this change should be less than 0.1 nm RMS, this is not attainable. Nevertheless, the majority of the surface change is second- and fourth-order components (power components and third-order spherical aberration components). and the higher-order components are small. Second-order and fourth-order surface change components can be compensated to a certain degree by adjusting the surface spacing. In other words, it is sufficient to ensure that the reproducibility of the surface changes associated only with higher-order components are held to 0.1 nm RMS or smaller. This can be accomplished by sufficient reduction of the stress from the film.

As described above, the present invention provides an aspheric-surface-shape measuring interferometer displaying good reproducibility, and moreover makes it possible to measure wavefront aberration with high precision. In addition, the present invention permits improvement in the absolute accuracy of precision surface measurements in an aspheric-surface-shape measuring interferometer. In addition, the present invention permits manufacture of a projection optical system having excellent performance.

Adoption of the present invention also makes it possible to accurately verify the shape of a null wavefront, as well as the transmission characteristics of such a null wavefront, without the need to use a reflective standard. Moreover, adoption of an interferometer system according to the present invention makes it possible to calibrate an aspheric null element with high precision and in a short period of time.

Furthermore, the wavefront-aberration-measuring interferometers of the fifth through eleventh embodiments of the present invention discussed above can be assembled as part of an exposure apparatus. In particular, when an SOR undulator of a wavelength which may be used for exposure is used as light source in a wavefront-aberration-measuring interferometers, as was the case in the fifth and sixth embodiments, this will be favorable since the light source unit can also serve as the exposure light source. When a laser plasma X-ray source of a wavelength which may be used for exposure in a wavefront-aberration-measuring interferometers, as was the case in the seventh through tenth embodiments, this will be favorable since the light source unit can also serve as the exposure light source. In addition, the wavefront-aberration-measuring interferometers of the eleventh embodiment of the present invention requires a laser light source to be furnished separate from the exposure light source. However, this laser light source can also serve as light source for an alignment system or as light source for an autofocus system in the exposure apparatus. In addition, in the wavefront-aberration-measuring interferometers of the fifth through eleventh embodiments of the present invention, when this light source is shared by the exposure apparatus, detector 60 serving as detector may also be fashioned such that it is removable from the exposure apparatus. In this case, the wavefront aberration of projection optical system 37 can be measured by attaching such a removable unit to the exposure apparatus in the event that maintenance or the like is required. Consequently, there will be no need to provide a dedicated wavefront-aberration-measuring interferometer for each and every exposure apparatus, permitting reduction in the cost of the exposure apparatus.

In addition, while detector 60 has been adopted as detector in the fifth through tenth embodiments of the present invention discussed above, a member having a function that converts emitted light in the soft X-ray region to visible light (for example, a fluorescent plate) may be provided at the position of the detector 60 and used in place thereof, and the visible light from this member may be detected by a detector such as a CCD.

Furthermore, the embodiments of the present invention discussed above describe a manufacturing method of a projection optical system 37 in the context of an exposure apparatus that uses soft X-rays of wavelength around 10 nm as exposure light, wavefront-aberration-measuring interferometers ideally suited to the measurement of the wavefront aberration of this projection optical system 37, surface-shape-measuring interferometers ideally suited to measurement of the surface shape of a reflective surface in this projection optical system 37, and a calibration method for such an interferometer. However, the present invention is not limited to this soft X-ray wavelength. For example, the present invention can be applied to a projection optical system or wavefront-aberration-measuring interferometer for hard X-rays of wavelength shorter than soft X-rays, and to a surface-shape-measuring interferometer that measures the surface shape of an optical element of a hard X-ray projection optical system, and can also be applied to the vacuum ultraviolet region (100 to 200 nm) of wavelength longer than soft X-rays. Furthermore, measurement and manufacturing of a precision much greater than hitherto possible becomes possible if the present invention is applied to a vacuum-ultraviolet projection optical system or wavefront-aberration-measuring interferometer, or to surface shape measurement of an optical element in a vacuum-ultraviolet projection optical system.

Thus, the present invention is not to be limited by the specific modes for carrying out the invention described above. In particular, while the present invention has been described in terms of several aspects, embodiments, modes, and so forth, the present invention is not limited thereto. In fact, as will be apparent to one skilled in the art, the present invention can be applied in any number of combinations and variations without departing from the spirit and scope of the invention as set forth in the appended claims, and it is intended to cover all alternatives, modifications and equivalents as may be included within the spirit and scope of the invention as defined in the appended claims.

What is claimed is:

1. An apparatus for measuring wavefront aberration of an optical system having an object plane and an image plane, comprising:
   a. a light source for supplying light of a predetermined wavelength;
   b. a first pinhole member capable of forming a first spherical wavefront from said light arranged at one of said object plane and said image plane, said first pinhole member having a plurality of first pinholes arrayed in two dimensions along a surface perpendicular to an optical axis of the optical system;
   c. a second pinhole member arranged at the opposite one of said object plane and said image plane of said first pinhole member, said second pinhole member having a plurality of second pinholes arrayed at a position corresponding to the imaging position where said plurality of first pinholes is imaged by said optical system;
   d. a diffraction grating arranged in the optical path between said first and second pinhole members;
   e. a diffracted light plate member that selectively transmits diffracted light of one or more higher predetermined diffraction orders associated with said diffraction grating; and
   f. a detector arranged to detect interference fringes arising from the interference between a second spherical wavefront generated by a zeroeth diffraction order passing through said second pinhole member and said one or more higher predetermined diffraction orders passing through said diffracted light plate member.

2. An apparatus according to claim 1, wherein said light source is one among the group of light sources consisting of: synchrotron, laser and laser plasma X-ray.

3. An apparatus according to claim 2, wherein:
   a. said light source is a laser plasma X-ray source; and
   b. said first plurality of pinholes comprises pinhole groups comprising a plurality of pinholes.

4. An apparatus according to claim 3, wherein said plurality of pinholes in said pinhole groups is arrayed along a predetermined one-dimensional direction.

5. An apparatus according to claim 4, wherein said plurality of pinholes has an array pitch that is 10 to 25 times the Airy disk radius determined by the numerical aperture on said first pinhole side of the optical system and said predetermined wavelength.

6. An apparatus according to claim 3, wherein said plurality of pinholes constituting said pinhole group each has a slit-shaped aperture extending in a predetermined one-dimensional direction.

7. An apparatus according to claim 1, further including:
   a. first selective illumination means for selectively illuminating a first portion of said plurality of first pinholes of said first pinhole member; and
   b. selective light receiving means for selectively receiving said second spherical wavefront from a second portion of said plurality of second pinholes corresponding to said first portion, and diffracted light of said predetermined order that passes through said second portion.

8. An apparatus according to claim 1, further including a fringe scanning means for moving said diffraction grating so as to perform fringe scanning.

9. An apparatus for measuring wavefront aberration of an optical system having an object plane and an image plane, comprising:
   a. a light source for supplying coherent light;

b. a beam splitter that splits said coherent light into first and second light beams each having an associated optical path length;

c. a first pinhole member, arranged in one of the object plane and image plane, that uses said first light beam to generate a first spherical wave;

d. a pinhole mirror having a plurality of apertures arrayed two-dimensionally in the opposite one of the object plane and the image plane where said first pinhole member is arranged, that transmits said second beam, and a reflective portion that reflects said first light beam from said optical system; and e. wherein the wavefront aberration of the optical system is calculated based on interference fringes generated by interference arising from a second spherical wave generated by said plurality of apertures of said pinhole mirror based on said second light beam, and said first light beam reflected by said reflective portion of said pinhole mirror.

10. An apparatus according to claim 9, further including a fringe scanning means that changes at least one of said optical path lengths of said first and second light beams.

* * * * *